(12) United States Patent
Chang et al.

(10) Patent No.: US 12,266,668 B2
(45) Date of Patent: Apr. 1, 2025

(54) IMAGE SENSOR INCLUDING SEPARATION STRUCTURE

(71) Applicant: SAMSUNG ELECTRONICS CO., LTD., Suwon-si (KR)

(72) Inventors: Chongkwang Chang, Hwaseong-si (KR); Donghoon Khang, Hwaseong-si (KR); Jinyoung Kim, Suwon-si (KR); Kwangyoung Oh, Hwaseong-si (KR); Taehun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 595 days.

(21) Appl. No.: 17/643,938

(22) Filed: Dec. 13, 2021

(65) Prior Publication Data
US 2022/0238583 A1     Jul. 28, 2022

(30) Foreign Application Priority Data
Jan. 26, 2021   (KR) .......................... 10-2021-0010826

(51) Int. Cl.
*H01L 27/146*     (2006.01)
(52) U.S. Cl.
CPC .. *H01L 27/14621* (2013.01); *H01L 27/14627* (2013.01); *H01L 27/1463* (2013.01)
(58) Field of Classification Search
CPC .................................................. H01L 27/1463
See application file for complete search history.

(56) References Cited

U.S. PATENT DOCUMENTS

| 8,030,721 | B2 | 10/2011 | Hsu et al. |
| 8,390,089 | B2 | 3/2013 | Chen et al. |
| 9,923,009 | B1 | 3/2018 | Hsiung et al. |
| 2012/0025199 | A1* | 2/2012 | Chen ................... H01L 27/1464 438/96 |
| 2015/0349001 | A1* | 12/2015 | Wang ................ H01L 27/14687 257/443 |

(Continued)

FOREIGN PATENT DOCUMENTS

| CN | 108573988 | 9/2018 |
| CN | 109638028 | 4/2019 |
| JP | 2019110345 | 7/2019 |

*Primary Examiner* — Ali Naraghi
(74) *Attorney, Agent, or Firm* — F. CHAU & ASSOCIATES, LLC

(57) ABSTRACT

An image sensor includes a substrate having first and second surfaces. A separation structure penetrates the substrate. Photoelectric conversion device regions are spaced apart from each other in the substrate. Color filters are disposed on the second surface of the substrate. Microlenses are disposed on the color filters. The separation structure includes lower and upper separation patterns, first line portions that run parallel to each other, and second line portions that perpendicularly intersect the first line portions. An upper surface of the lower separation pattern or a lower surface of the upper separation pattern has a wavy or sawtooth shape. In intersecting regions in which the first line portions and the second line portions intersect, a vertical length of one of the lower separation pattern and the upper separation pattern is about 2 to 10 times greater than a vertical length of the other.

20 Claims, 26 Drawing Sheets

(56) References Cited

U.S. PATENT DOCUMENTS

| | | | |
|---|---|---|---|
| 2015/0372031 A1* | 12/2015 | Yoon | H01L 27/1463 |
| | | | 257/446 |
| 2017/0287962 A1* | 10/2017 | Ootsuka | H01L 27/1463 |
| 2018/0151609 A1 | 5/2018 | Tai et al. | |
| 2019/0115378 A1 | 4/2019 | Nah et al. | |
| 2019/0165026 A1 | 5/2019 | Kuo et al. | |
| 2019/0189653 A1 | 6/2019 | Lee et al. | |
| 2019/0252425 A1* | 8/2019 | Ogawa | H01L 27/14603 |
| 2020/0006410 A1 | 1/2020 | Wu et al. | |
| 2020/0091210 A1 | 3/2020 | Wu et al. | |
| 2020/0135798 A1* | 4/2020 | Tsao | H01L 27/14627 |
| 2020/0212092 A1 | 7/2020 | Kwag et al. | |
| 2020/0219911 A1* | 7/2020 | Hur | H01L 27/14603 |
| 2020/0243580 A1 | 7/2020 | Wu et al. | |
| 2020/0286937 A1 | 9/2020 | Honda et al. | |
| 2021/0005647 A1* | 1/2021 | Kwag | H01L 27/14643 |

* cited by examiner

IMAGE SENSOR INCLUDING SEPARATION STRUCTURE

CROSS REFERENCE TO RELATED APPLICATION(S)

This application claims benefit of and priority to Korean Patent Application No. 10-2021-0010826 filed on Jan. 26, 2021 in the Korean Intellectual Property Office, the disclosure of which is herein incorporated by reference in its entirety.

TECHNICAL FIELD

The present disclosure relates to an image sensor, and more particularly, to an image sensor including a separation structure.

DISCUSSION OF THE RELATED ART

Image sensors are often used to obtain an image and convert the image into an electrical signal. Image sensors have been incorporated into a wide variety of electronic devices such as digital cameras, mobile phone cameras, portable camcorders, cameras mounted on automobiles, security devices, and robots. Efforts have been taken to design image sensors that are of a smaller size and higher resolution.

SUMMARY

An image sensor includes a substrate having a first surface and a second surface opposing each other; a separation structure penetrating the substrate; photoelectric conversion device regions spaced apart from each other by the separation structure in the substrate; color filters disposed on the second surface of the substrate; and microlenses disposed on the color filters. The separation structure includes a lower separation pattern and an upper separation pattern disposed on the lower separation pattern. The separation structure includes first line portions that are parallel to each other and extend in a first horizontal direction, and second line portions that perpendicularly intersect the first line portions and are parallel to each other. In a cross-sectional structure of one of the first line portions of the separation structure taken in the first horizontal direction, an upper surface of the lower separation pattern and/or a lower surface of the upper separation pattern has a wavy or sawtooth shape. In intersecting regions in which the first line portions and the second line portions intersect each other, a vertical length of one of the lower separation pattern and the upper separation pattern is about 2 to about 10 times greater than a vertical length of the other.

An image sensor includes a first chip structure including a first substrate, a first circuit device and a first interconnection structure disposed on the first substrate, and a first insulating layer covering the first circuit device and the first interconnection structure on the first substrate; and a second chip structure disposed on the first chip structure. The second chip structure includes a second substrate having a first surface opposing the first chip structure and a second surface opposing the first surface; a second circuit device and a second interconnection structure disposed between the first surface of the second substrate and the first chip structure; a second insulating layer covering the second circuit device and the second interconnection structure between the first surface of the second substrate and the first chip structure; a separation structure disposed in the substrate; photoelectric conversion device regions spaced apart from each other by the separation structure disposed in the substrate; an insulating structure disposed on the second surface of the second substrate; color filters disposed on the insulating structure; and microlenses disposed on the color filters. The separation structure includes a lower separation pattern having an upper surface in the substrate and an upper separation pattern having a lower surface in the substrate. At least a portion of the upper surface of the lower separation pattern is in contact with at least a portion of the lower surface of the upper separation pattern. The separation structure includes first line portions that are parallel to each other and extend in a first horizontal direction, and second line portions that perpendicularly intersect the first line portions and are parallel to each other. Each of the first line portions includes line regions and intersecting regions alternately arranged in the first horizontal direction. The intersecting regions of the first line portions are regions of the first line portions intersecting the second line portions. In a cross-sectional structure of one of the first line portions taken in the first horizontal direction, the upper surface of the lower separation pattern has a wavy or sawtooth shape. In the intersecting regions, a vertical length of the lower separation pattern is greater than a vertical length of the upper separation pattern, and in the intersecting regions, a first level difference between the upper surface of the lower separation pattern and the first surface of the substrate is about 1.5 µm to about 10 µm.

An image sensor includes a first chip structure including a first substrate, a first circuit device and a first interconnection structure disposed on the first substrate, and a first insulating layer covering the first circuit device and the first interconnection structure disposed on the first substrate; and a second chip structure disposed on the first chip structure. The second chip structure includes a second substrate having a first surface opposing the first chip structure and a second surface opposing the first surface; a separation structure disposed in the second substrate; a second circuit device and a second interconnection structure disposed between the first surface of the second substrate and the first chip structure; a second insulating layer covering the second circuit device and the second interconnection structure between the first surface of the second substrate and the first chip structure; photoelectric conversion device regions disposed in the second substrate; an insulating structure disposed on the second surface of the second substrate; color filters disposed on the insulating structure; and microlenses disposed on the color filters. The separation structure includes a lower separation pattern and an upper separation pattern disposed on the lower separation pattern. The separation structure includes first line portions that are parallel to each other and extend in a first horizontal direction, and second line portions that perpendicularly intersect the first line portions and are parallel to each other. Each of the first line portions includes line regions and intersecting regions alternately arranged in the first horizontal direction. In the first line portions, the intersecting regions are regions of the first line portions intersecting the second line portions. In a cross-sectional structure of one of the first line portions taken in the first horizontal direction, an upper surface of the lower separation pattern and/or a lower surface of the upper separation pattern has a wavy or sawtooth shape, and in the intersecting regions, a vertical length of one of the lower separation pattern and the upper separation pattern is about 2 to about 10 times greater than a vertical length of the other.

BRIEF DESCRIPTION OF DRAWINGS

The above and other aspects and features of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
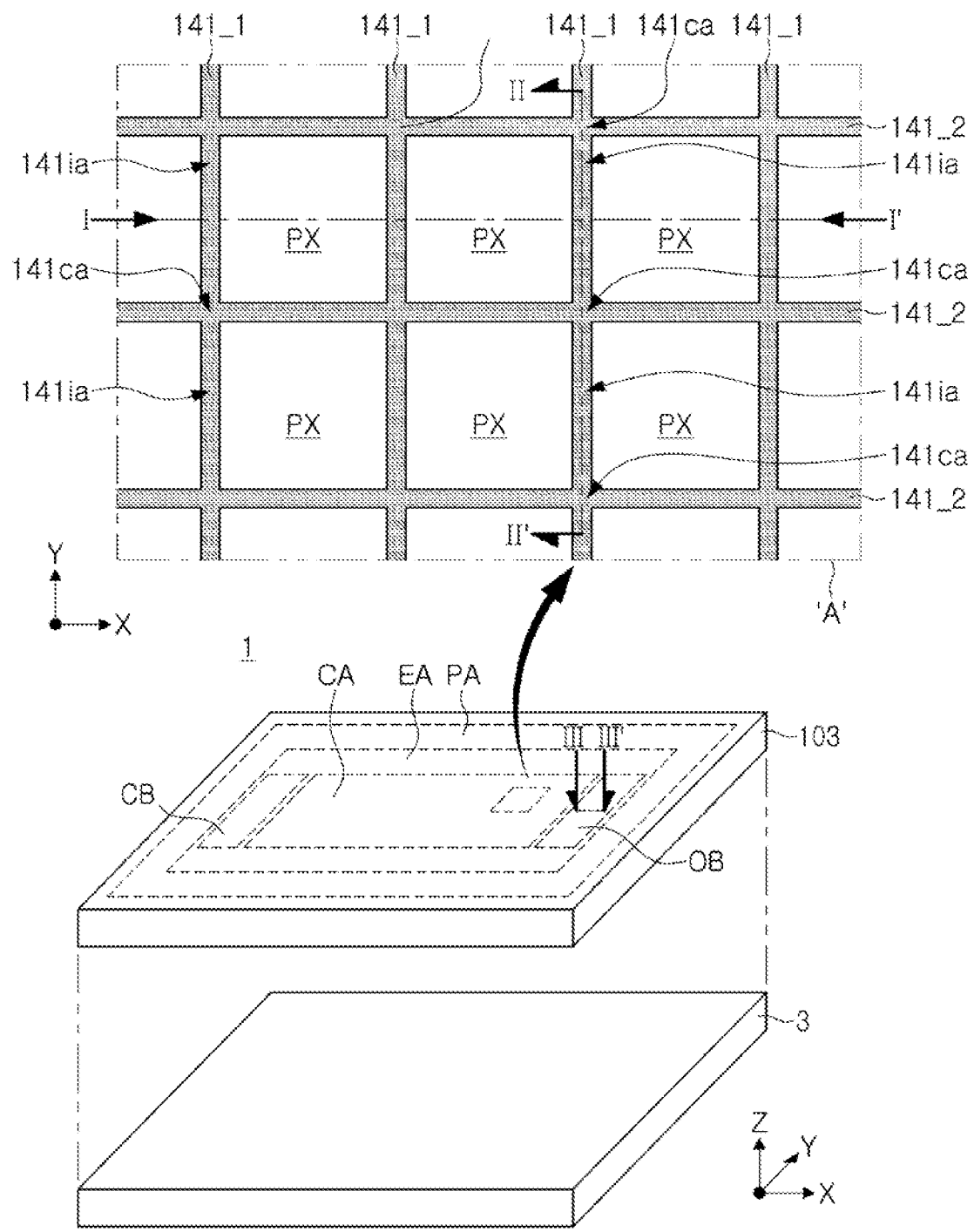
FIG. 1 is a diagram illustrating an image sensor according to an example embodiment of the present disclosure.

An example of an image sensor will be described with reference to FIG. 1. FIG. 1 is an exploded perspective diagram illustrating an image sensor according to an example embodiment, and a partially enlarged region indicated by "A" in FIG. 1 may represent a planar shape of a portion of the image sensor illustrated in an exploded perspective diagram.

Referring to FIG. 1, the image sensor 1, according to an example embodiment, may include a first chip structure 3 and a second chip structure 103 disposed on the first chip structure 3. The first chip structure 3 may be a logic chip, and the second chip structure 103 may be an image sensor chip including a plurality of pixel regions PX. In an example, the first chip structure 3 may be a stacked chip structure including a logic chip and a memory chip.

The second chip structure 103 of the image sensor 1 may include a first region CA, a second region EA, and a third region PA.

The third region PA may be disposed on at least one side of a central region including the first region CA and the second region EA. For example, the third region PA may be disposed on both sides of the central region including the first region CA and the second region EA, or may surround the central region. The second region EA may be disposed on at least one side of the first region CA. For example, the second region EA may be disposed on one side of the first region CA, may be disposed on both sides of the first region CA, or may surround the first region CA.

The first region CA may include an active pixel sensor array region, and the second region EA may include an optical black region OB and an inter-chip connection region CB. The third region PA may include a pad region in which input/output pads are disposed. The third region PA may be referred to as a pad region.

The first region CA may be an active pixel sensor array region to which light is incident, and the optical black region OB of the second region EA may be a region to which light is not incident. The inter-chip connection region CB of the second region EA may be a region electrically connecting an interconnection structure of the first chip structure 3 to an interconnection structure of the second chip structure 103. In example embodiments, the optical black region OB and the inter-chip connection region CB may be arranged in various shapes.

The second chip structure 103 may include a plurality of pixel regions. In FIG. 1, the plurality of pixel regions PX may be indicated by reference numeral "PX" on a plane indicated by "A," an enlarged portion of the second chip structure 103. The pixel regions PX may be disposed in the first region CA, the active pixel sensor array region.

When viewed on the same plane indicated by "A" in FIG. 1, the second chip structure 103 may further include a separation structure 141 disposed between neighboring pixel regions of the pixel regions PX.

When viewed on the same plane indicated by "A" in FIG. 1, the separation structures 141 may run parallel to each other and may include first line portions 141_1 and second line portions 141_2 that are parallel to their like structures. The second line portions 141_2 may perpendicularly intersect the first line portions 141_1. Each of the first line portions 141_1 may extend in a first horizontal direction Y, and each of the second line portions 141_2 may extend in a second horizontal direction X perpendicular to the first horizontal direction Y.

Each of the first and second line portions 141_1 and 141_2 may include line regions and intersecting regions. In the first and second line portions 141_1 and 141_2, the first line portions 141_1 and the second line portions 141_2 may intersect each other in the intersecting regions. For example, each of the first line portions 141_1 may include line regions 141*ia* and intersecting regions 141*ca* alternately arranged in the first horizontal direction Y. Similarly, each of the second line portions 141_2 may include line regions and intersecting regions alternately arranged in the second horizontal direction X.

Figure 2A:
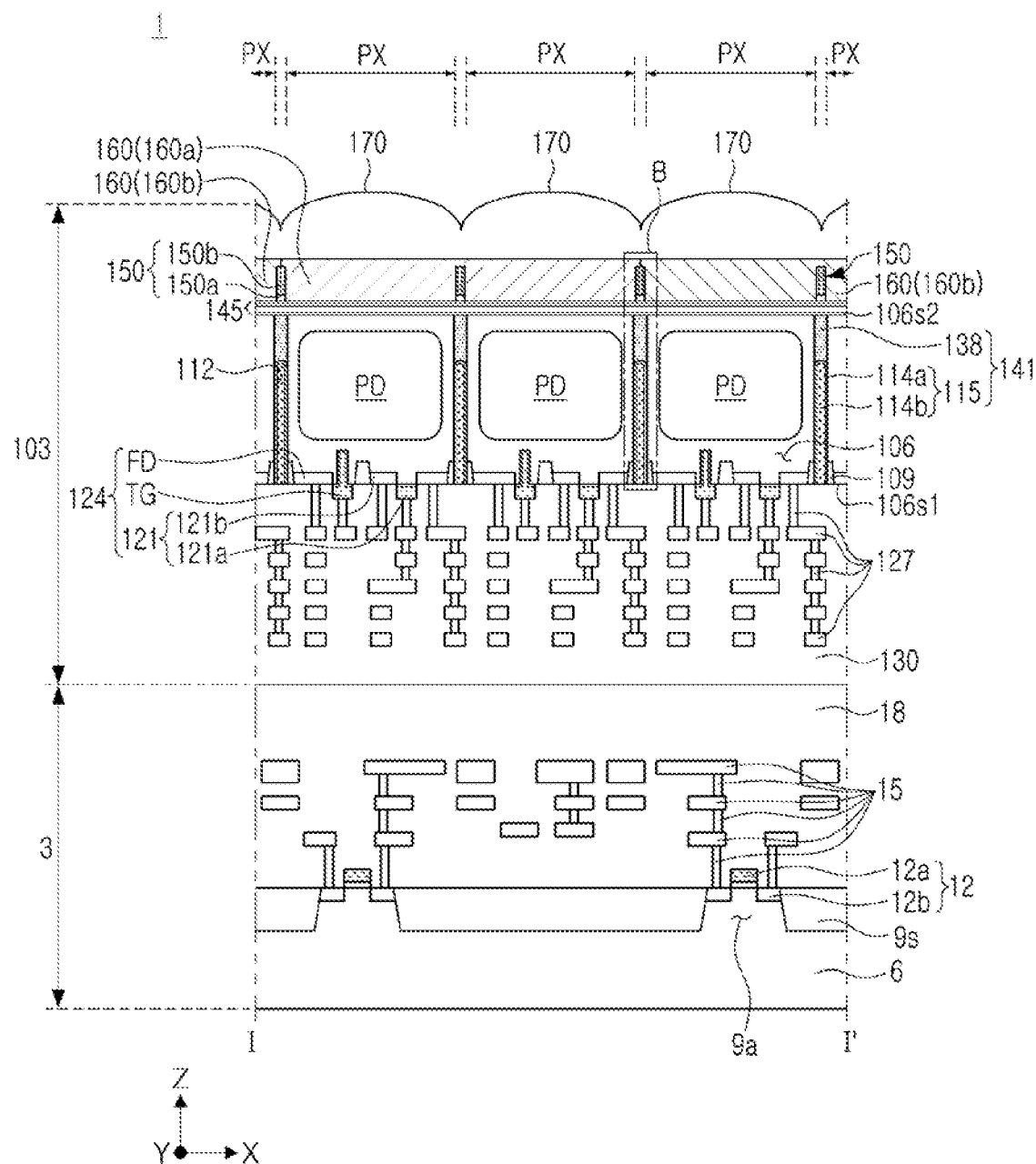
FIGS. 2A to 2C and 3 are cross-sectional diagrams illustrating an image sensor according to an example embodiment of the present disclosure.

An example of the image sensor 1 described with reference to FIG. 1 will be described with reference to FIGS. 2A to 2C. FIG. 2A is a cross-sectional diagram illustrating a region taken along line I-I' in FIG. 1, FIG. 2B is an enlarged cross-sectional diagram illustrating region "B" in FIG. 2A, and FIG. 2C is a cross-sectional diagram illustrating a region taken along line II-II' in FIG. 1 in a region from the first level L1 to a second level L2 higher than the first level L1 in FIG. 2B.

Figure 2B:
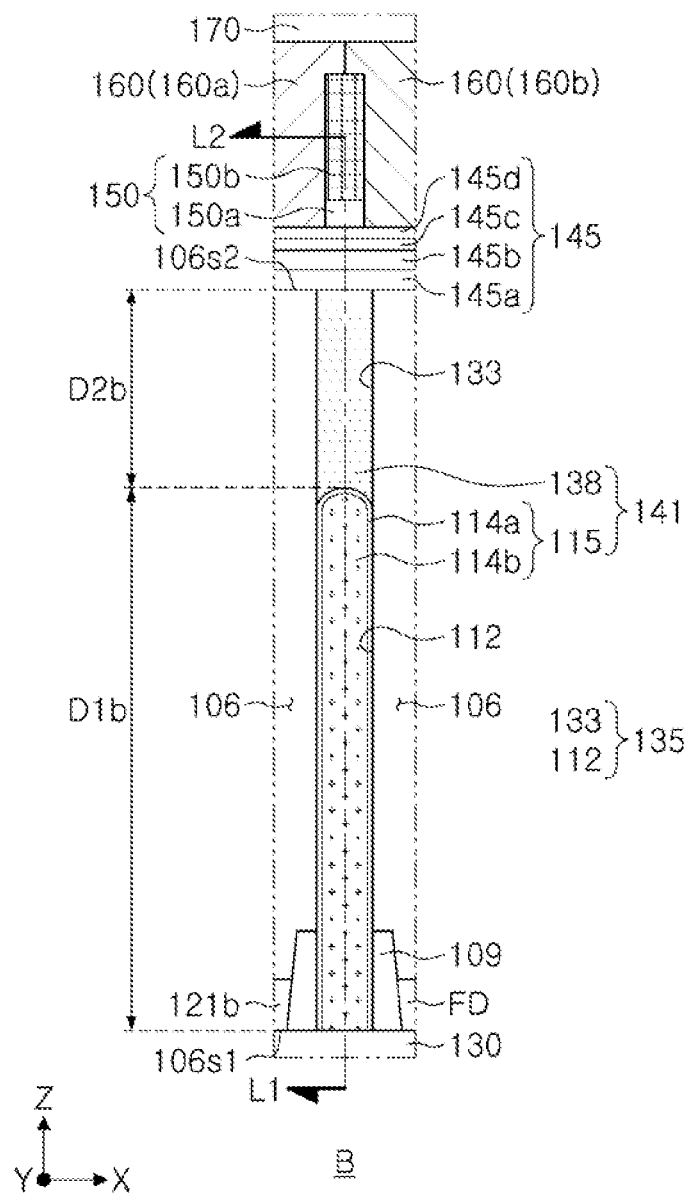
Figure 2C:
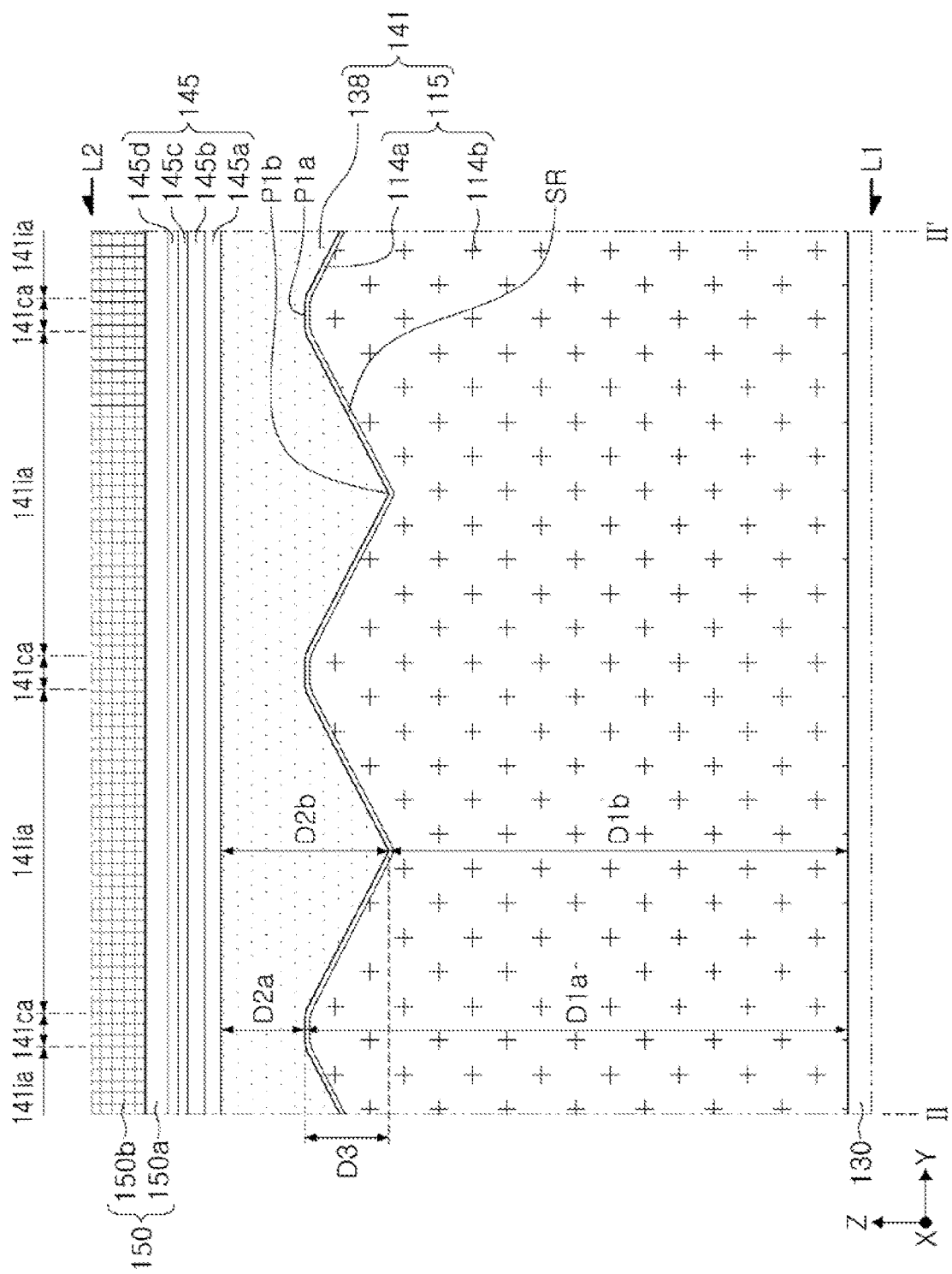

Referring to FIGS. 2A to 2C together with FIG. 1, the first chip structure 3 of the image sensor 1 may include a first substrate 6, an isolation layer 9*s* defining an active region 9*a* on the first substrate 6, a first circuit device 12 and a first interconnection structure 15 on the first substrate 6, and a first insulating layer 18 covering the first circuit device 12 and the first interconnection structure 15 on the first substrate 6. The first substrate 6 may be a semiconductor substrate. For example, the first substrate 6 may be a semiconductor substrate including a semiconductor material, such as a single crystal silicon substrate, for example. The first circuit device 12 may include a device such as a transistor including a gate 12*a* and a source/drain 12*b*.

The second chip structure 103 may include a second substrate 106 having a first surface 106*s*1 and a second surface 106*s*2 opposing each other, an isolation layer 109 disposed on the first surface 106*s*1 of the second substrate 106 and defining an active region, a second circuit device 124 and a second interconnection structure 127 disposed between the first surface 106*s*1 of the second substrate 106 and the first chip structure 3, and a second insulating layer 130 covering the second circuit device 124 and the second interconnection structure 127 between the first surface 106*s*1 of the second substrate 106 and the first chip structure 3. The second chip structure 103 may further include a separation structure 141 and photoelectric conversion device regions PD in the second substrate 106. The first surface 106*s*1 of the second substrate 106 may oppose the first chip structure 3. The second substrate 106 may be a semiconductor substrate. For example, the second substrate 206 may be a semiconductor substrate including a semiconductor material, such as a single crystal silicon substrate, for example.

The second circuit device 124 may include a transfer gate TG, a floating diffusion region FD, and a circuit transistor 121. The circuit transistor 121 may include a gate 121*a* and a source/drain 121*b*. The transfer gate TG may transfer charge from an adjacent photoelectric conversion device region PD to an adjacent floating diffusion region FD. The circuit transistor 121 may be a source follower transformer, a reset transistor, and/or a select transistor. The transfer gate TG may be a vertical transfer gate including a portion extending from the first surface 106*s*1 of the second substrate 106 into the second substrate 106. The second interconnection structure 127 may include multilayer interconnection lines disposed on different levels, and vias for electrically connecting the multilayer interconnection lines disposed on different levels and electrically connecting the multilayer interconnection lines to the second circuit device 124.

The first insulating layer 18 and the second insulating layer 130 may be in contact with and bonded to each other. Each of the first and second insulating layers 18 and 130 may be formed as multiple layers including different types of insulating layers. For example, the second insulating layer 130 may be formed as multiple layers including two of a silicon oxide layer, a low-k dielectric layer, and a silicon nitride layer, or all three.

The photoelectric conversion device regions PD may be formed in the second substrate 106 and may be spaced apart from each other by the separation structure 141. The pixel regions PX may be defined as regions including the photoelectric conversion device regions PD. For example, each of the pixel regions PX may include a single photoelectric conversion device region PD. The photoelectric conversion device regions PD may generate and accumulate electric charges corresponding to incident light. For example, the photoelectric conversion device regions PD may include a photodiode, a photo transistor, a photo gate, a pinned photo diode (PPD), and combinations thereof.

The separation structure 141 may surround each of the photoelectric conversion device regions PD. At least a portion of the separation structure 141 may be disposed in the separation trench 135 penetrating the second substrate 106. At least a portion of the separation structure 141 may penetrate the second substrate 106. The separation structure 141 may be connected to a portion of the isolation layer 109. For example, the separation structure 141 may penetrate the isolation layer 109. The isolation layer 109 may include an insulating material such as silicon oxide.

The separation trench 135 may include a lower separation trench 112 extending from the first surface 106*s*1 of the second substrate 106 into the second substrate 106, and an upper separation trench 133 extending from the second surface 106*s*2 of the second substrate 106 into the second substrate 106. In an example, at least a portion of the lower separation trench 112 and at least a portion of the upper separation trench 133 may be connected to each other. In an example, the lower separation trench 112 may penetrate the isolation layer 109 and may extend into the second substrate 106.

The separation structure 141 may include a lower separation pattern 115 disposed in the lower separation trench 112 and an upper separation pattern 138 disposed in the upper separation trench 133. The upper separation pattern 138 may be disposed on the lower separation pattern 115. An upper surface of the lower separation pattern 115 and a lower surface of the upper separation pattern 138 may be disposed in the second substrate 106.

In an example, in the separation structure 141, the lower separation pattern 115 may reduce dark current of the image sensor 1 (e.g., unwanted current that is generated in the image sensor 1 for reasons other than the observation of light), and the upper separation pattern 138 may prevent cross talk of the image sensor 1. Accordingly, the separation structure 141 may increase a signal to noise ratio of the image sensor 1, thereby increasing the resolution of the image sensor 1.

In an example, the lower surface of the lower separation pattern 115 may be coplanar with the first surface 106*s*1 of the second substrate 106. In an example, the upper surface of the upper separation pattern 138 may be coplanar with the second surface 106*s*2 of the second substrate 106. In an example, at least a portion of the upper surface of the lower separation pattern 115 may be in contact with at least a portion of the lower surface of the upper separation pattern 138. For example, the entire upper surface of the lower separation pattern 115 may be in contact with the entire lower surface of the upper separation pattern 138. The upper surface of the lower separation pattern 115 and the lower surface of the upper separation pattern 138 may be indicated by reference numeral "SR" in FIG. 2C.

In a cross-sectional structure of one of the first line portions 141_1 (in FIG. 1) of the separation structure 141 in the first horizontal direction Y, the cross-sectional structure as in FIG. 2C, for example, the upper surface of the lower separation pattern 115 and/or the lower surface of the upper separation pattern 138, disposed in the second substrate 106, may have a wavy shape in which concave portions and convex portions alternately arranged in the first horizontal direction Y or a sawtooth shape in which upwardly sloped line segments alternate with downwardly sloped line segments. There may also be a horizontal line segment disposed between the upwardly sloped line segments and the downwardly sloped line segments. For example, the upper surface SR of the lower separation pattern 115 may have a wavy or sawtooth shape in which concave portions P1b and convex portions P1a may be alternately arranged in the first horizontal direction Y.

In example embodiments, the term "concave portion" may refer to a downwardly bowed shape in the diagram, and "convex portion" may refer to an upwardly bowed shape in the diagram.

Upper ends of the convex portions P1a of the upper surface SR of the lower separation pattern 115 may be disposed in the intersecting regions 141ca, and lower end of the concave portions P1b of the upper surface SR of the lower separation pattern 115 may be disposed in line regions 141ia.

In a cross-sectional structure of one of the first line portions 141_1 of the separation structure 141 along the second horizontal direction X, the cross-sectional structure as in FIG. 2B, for example, the upper surface of the lower separation pattern 115 may be concave.

In an example, in the intersecting regions 141ca (in FIGS. 1 and 2C) in which the first line portions 141_1 (in FIG. 1) and the second line portions 141_2 (in FIG. 1) intersect each other, a vertical length of one of the lower separation pattern 115 and the upper separation pattern 138 may be about 2 times to about 10 times greater than a vertical length of the other. For example, in the separation structure 141 for improving dark current properties of the image sensor 1 and preventing cross talk, in the intersecting regions 141ca, the first vertical length D1a of the lower separation pattern 115 may be about 2 times to about 10 times greater than the second vertical length D2a of the upper separation pattern 138. In an example, in the intersecting regions 141ca, the first vertical length D1a of the lower separation pattern 115 may be about 3 times to about 9 times greater than the second vertical length D2a of the upper separation pattern 138.

In an example, in the intersecting regions 141ca, the first vertical length D1a of the lower separation pattern 115 may be about 1.5 μm to about 10 μm.

In an example, in the intersecting regions 141ca, the first vertical length D1a of the lower separation pattern 115 may be about 2 μm to about 9 μm.

In the intersecting regions 141ca, the first vertical length D1a may refer to "first level difference" (or a first distance between levels) between the upper surface of the lower separation pattern 115 and the first surface 106s1 of the second substrate 106. In the intersecting regions 141ca, the second vertical length D2a may refer to second level difference (or a second distance between levels) between the lower surface of the upper separation pattern 138 and the second surface 106s2 of the second substrate 106.

In an example, the lower separation pattern 115 may have a minimum vertical length D1b in the line regions 141ia (in FIGS. 1 and 2C), and may have a maximum vertical length in the intersecting regions 141ca (in FIGS. 1 and 2C). The maximum vertical length may be the first vertical length D1a described above.

In an example, the upper separation pattern 138 may have a maximum vertical length D2b in the line regions 141ia (in FIGS. 1 and 2C), and may have a minimum vertical length in the intersecting regions 141ca (in FIGS. 1 and 2C). The minimum vertical length may be the second vertical length D2a described above.

The level difference D3 between the lower ends of the concave portions P1b and the upper ends of the convex portions P1a may be a difference between the maximum vertical length D1a of the lower separation pattern 115 and the minimum vertical length D1b. The level difference D3 between the lower ends of the concave portions P1b and the upper ends of the convex portions P1a may be the same as a difference between the maximum vertical length D2b of the upper separation pattern 138 and the minimum vertical lengths D2a.

In an example, in the concave portion P1b and the convex portion P1a adjacent to each other among the concave portions P1b and the convex portions P1a, a level difference D3 between a lowermost end of the concave portion P1b and an uppermost end of the convex portion P1a may be the same as the second vertical length D2a or may be smaller than the second vertical length D2a.

In an example, the lower separation pattern 115 may include a lower material pattern 114b and a lower material layer 114a covering at least a side surface of the lower material pattern 114b. The lower material layer 114a may surround a side surface of the lower material pattern 114b and may cover an upper surface of the lower material pattern 114b.

The lower separation pattern 115 may include a conductive material which may apply a negative bias to reduce dark current of the image sensor 1. For example, in the lower separation pattern 115, the lower material pattern 114b may include polysilicon to which a negative bias may be applied, and the lower material layer 114a may include an insulating material. For example, the lower material layer 114a may include silicon oxide and/or a high-k dielectric material. For example, the lower material layer 114a may include silicon oxide.

As used herein, the term "high-k dielectric material" means any dielectric material having a dielectric constant that is greater than that of silicon oxide.

In an example, the upper separation pattern 138 may include an insulating material. For example, the upper separation pattern 138 may include silicon oxide. In an example, the upper separation pattern 138 may include a plurality of insulating layers including a silicon oxide layer and a high-k dielectric layer. The upper separation pattern 138, which may include an insulating material, may prevent cross talk of the image sensor 1.

In an example, when viewed from the first surface 106s1 of the second substrate 106, the upper surface SR of the lower separation pattern 115 disposed in the second substrate 106 may be disposed on a level higher than a level of the upper surface of the isolation layer 109 disposed in the second substrate 106.

The second chip structure 103 may further include an insulating structure 145 disposed on the second surface 106s2 of the second substrate 106. The insulating structure 145 may cover the separation structure 141. The insulating structure 145 may include an anti-reflective layer which may adjust a refractive index such that incident light may travel to the photoelectric conversion device regions PD with high transmittance.

The insulating structure 145 may include a plurality of stacked insulating layers. For example, the plurality of insulating layers of the insulating structure 145 may include a silicon oxide layer and a high-k dielectric layer. For example, the insulating structure 145 may include at least two or more of an aluminum oxide layer, a hafnium oxide layer, a silicon oxynitride layer, a silicon oxide layer, and a silicon nitride layer. For example, the insulating structure 145 may include a first layer 145a, a second layer 145b, a third layer 145c, and a fourth layer 145d stacked in that order. The first layer 145a may be an aluminum oxide layer, each of the second and fourth layers 145b and 145d may be a hafnium oxide layer, and the third layer 145c may be a silicon oxide layer. In an example, a thickness of the first layer 145a may be substantially the same as a thickness of the fourth layer 145d. In an example, a thickness of the second layer 145b may be greater than a thickness of each of the first and fourth layers 145a and 145d. For example, the thickness of the second layer 145b may be about 5 to about 7 times greater than the thickness of the first layer 145a. In an example, the thickness of the third layer 145c may be greater than the thickness of the second layer 145b. The thickness of the third layer 145c may be about 6 to about 8 times greater than the thickness of the first layer 145a.

The second chip structure 103 may further include a grid pattern structure 150 and color filters 160 on the insulating structure 145.

The grid pattern structure 150 may overlap the separation structure 141 in a vertical direction Z. The grid pattern structure 150 may include a first grid layer 150a and a second grid layer 150b stacked in that order. A thickness of the second grid layer 150b may be greater than a thickness of the first grid layer 150a. The first grid layer 150a and the second grid layer 150b may include different materials. For example, the first grid layer 150a may include a conductive material including a metal and/or a metal nitride. For example, the first grid layer 150a may include Ti, Ta, TiN, TaN, and/or W. The second grid layer 150b may include an insulating material. The second grid layer 150b may include a low refractive index (LRI) material. For example, the second grid layer 150b may include a low refractive index material having a refractive index in a range of about 1.1 to about 1.8. The second grid layer 150b may include oxide or nitride including Si, Al, or a combination thereof. For example, the second grid layer 150b may include silicon oxide having a porous structure or silica nanoparticles having a network structure.

In the grid pattern structure 150, since the first grid layer 150a may include a conductive material to work as a charge path for removing charges, optical cross-talk phenomenon of the image sensor 1 may be reduced.

The color filters 160 may pass light of a specific wavelength and the light reach the photoelectric conversion device regions PD. For example, the color filters 160 may include a mixture of a resin and a pigment including a metal or a metal oxide. A thickness of each of the color filters 160 may be greater than a thickness of the grid pattern structure 150. The color filters 160 may cover the grid pattern structure 150 on the insulating structure 145. The color filters 160 may cover a side surface and an upper surface of the grid pattern structure 150 on the insulating structure 145. The color filters 160 may include a green filter, a red filter, and a blue filter.

In an example, each of the color filters 160 may be disposed in a plurality of pixel regions PX. For example, the color filters 160 may include a first color filter 160a and a second color filter 160b of different colors, and a single first color filter 160a may be disposed in the plurality of pixel regions PX. One of the color filters 160, one of the first color filters 160a, for example, may overlap the plurality of photoelectric conversion device regions PD of the plurality of pixel regions PX, such that sensitivity of the same color, the color of the first color filter 160a, that is, a green color, for example, may increase in the image sensor 1. Similarly, sensitivity of red and blue may increase for the same reason as that of green.

The second chip structure 103 may further include microlenses 170 on the color filters 160. In an example, a plurality of the microlenses 170 may be disposed on one of the color filters 160. For example, a plurality of microlenses 170 may be disposed on a single first color filter 160a, and a plurality of microlenses 170 may be disposed on a single second color filter 160b.

Each of the microlenses 170 may overlap each of the photoelectric conversion device regions PD in the vertical direction Z. Each of the microlenses 170 may be convex in a direction spaced apart from the first chip structure 3, in a direction spaced apart from the second substrate 106, for example. The microlenses 170 may condense incident light into the photoelectric conversion device regions PD. The microlenses 170 may include a transparent photoresist material or a transparent thermosetting resin material. For example, the microlenses 170 may include a TMR vertical (manufactured by Tokyo Ohka Kogo, Co.) or an MFR resin (manufactured by Japan Synthetic Rubber Corporation), but an example embodiment thereof is not limited thereto.

Figure 3:
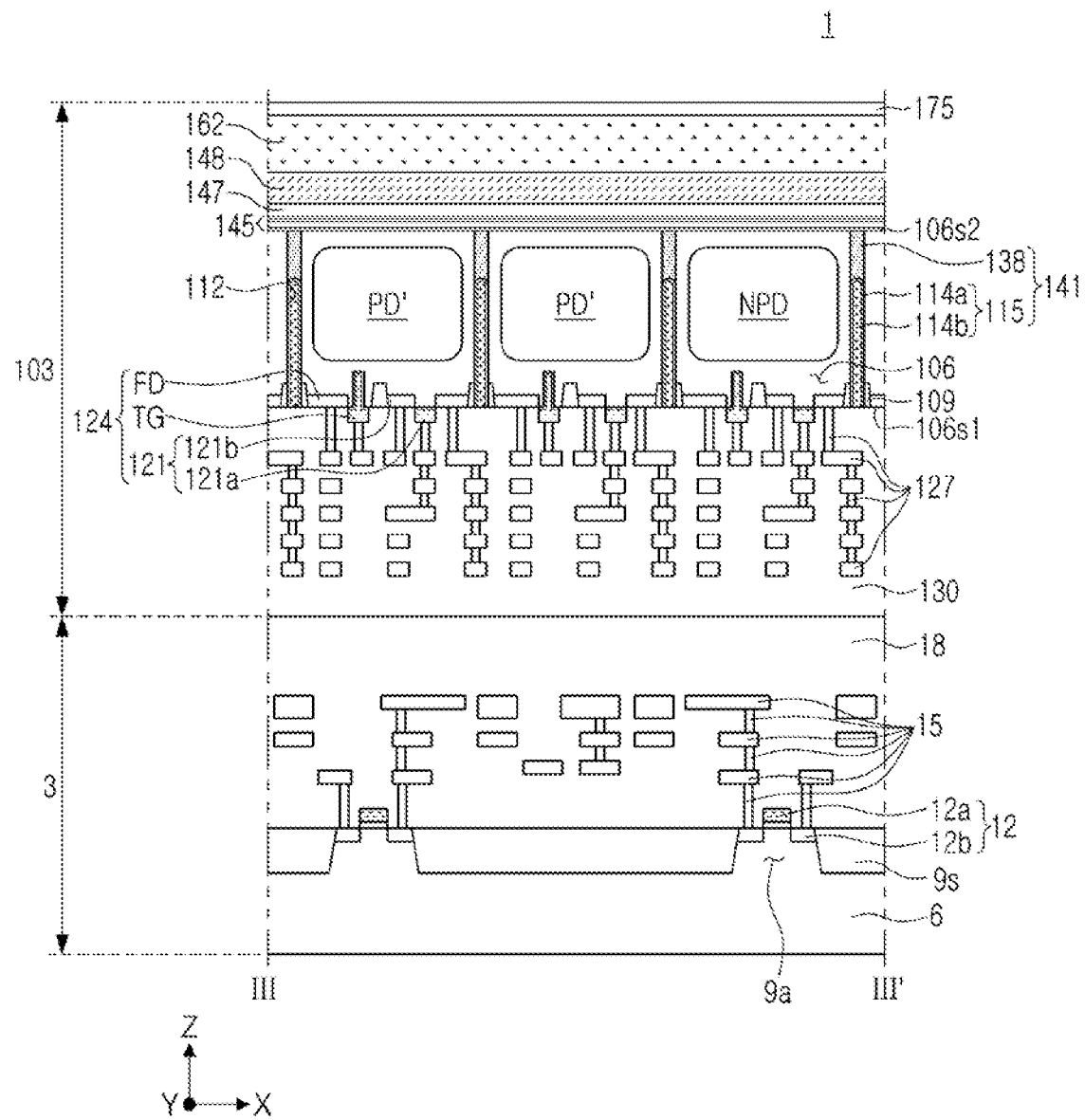

An example of a cross-sectional structure of the image sensor 1 including the optical black region OB described in FIG. 1 will be described with reference to FIG. 3. FIG. 3 is a cross-sectional diagram illustrating a region taken along line III-III' in FIG. 1. Hereinafter, in describing an example of the cross-sectional structure of the image sensor 1 with reference to FIG. 3, it may be assumed that elements that are not described in detail may be at least similar to corresponding elements that are described with reference to FIGS. 1 to 2C.

Referring to FIGS. 1 to 2C and FIG. 3, in the optical black region OB of the second chip structure 103, the region in which a photoelectric conversion device region PD', formed in the same manner as the photoelectric conversion device regions PD may be defined as a first reference region, and a region NPD in which the photoelectric conversion device region PD is not formed may be defined as a second reference region.

Hereinafter, in the cross-sectional structure in FIG. 3, a region indicated by reference numeral "PD'" may be defined as a first reference region, and a region indicated by reference numeral "NPD" may be defined as a second reference region.

The first reference region PD' and the second reference region NPD may be disposed in the second substrate 106, and may be separated from each other by the separation structure 141 as described in the aforementioned example with reference to FIGS. 1 to 2C. The separation structure 141 may surround side surfaces of the first reference region PD' and the second reference region NPD. The second reference region NPD may be a comparison region not including the photoelectric conversion device regions PD or a comparison region not including photodiodes of the photoelectric conversion device regions PD.

In the optical black region OB of the second region EA of the image sensor 1, the second chip structure 103 may include the insulating structure 145 as in the aforementioned example, which may be disposed on the second surface 106s2 of the second substrate 106.

In the optical black region OB of the second region EA of the image sensor 1, the second chip structure 103 may further include light-shielding conductive layers 147 and 148, a light-shielding color filter layer 162, and an upper capping layer 175, stacked in that order on the insulating structure 145.

The light-shielding conductive layers 147 and 148 and the light-shielding color filter layer 162 may form a light-shielding pattern for shielding light. The light-shielding patterns may block light from entering the first reference region PD' and the second reference region NPD. The light-shielding conductive layers 147 and 148 may include a metal nitride layer 147 and a metal layer 148 stacked in that order. The metal nitride layer 147 may include a material such as TiN or WN, and the metal layer 148 may include a material such as Ti, W, Cu, Al, Cu, or Ag.

The light-shielding color filter layer 162 may include a blue filter. The upper capping layer 175 may include the same material as a material of the microlenses 170.

The optical black region OB may be used to remove a noise signal caused by a dark current. For example, while light is blocked by the light-shielding conductive layers 147 and 148 and the light-shielding color filter layer 162, the first reference region PD' including a photodiode may be used as a reference pixel for removing noise by a photodiode. Also, while light is blocked by the light-shielding conductive layers 147 and 148 and the light-shielding color filter layer 162, the second reference region NPD not including a photodiode might not be a photodiode, and may be a region for checking process noise to remove noise caused by the elements.

In an example embodiment, the image sensor 1 may further include a connection conductive layer partially penetrating the second chip structure 103 in the inter-chip connection region CB of the second region EA, disposed in a via hole extending into the first chip structure 3, and electrically connecting the first chip structure 3 to the second chip structure 103.

In an example embodiment, the image sensor 1 may further include an input/output conductive layer partially penetrating the second chip structure 103 in the third region PA and extending into the first chip structure 3, and an input/output pad electrically connected to the input/output conductive layer.

In the description below, various modified examples of the image sensor 1 described above will be described with reference to FIGS. 4 to 13. In describing the modified examples of the image sensor 1, the elements which may be modified or replaced will be mainly described among the above-described elements, and the elements which might not be modified will be directly referred and described, or the descriptions thereof will not be provided, in which case it may be assumed that the description is the same as is provided elsewhere within the instant disclosure.

Figure 4:
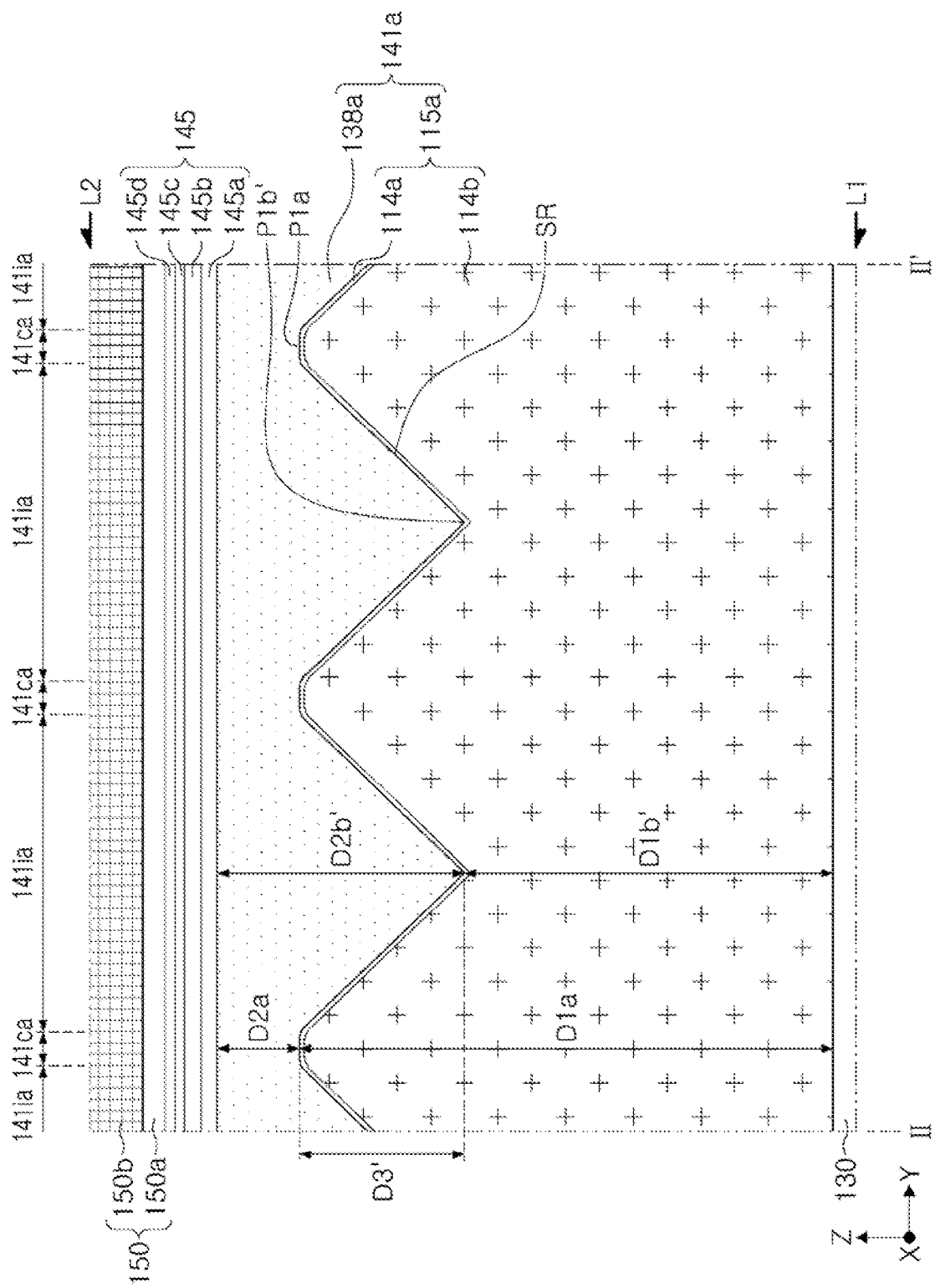
FIG. 4 is an enlarged cross-sectional diagram illustrating a modified example of an image sensor, illustrating a portion of the image sensor.

A modified example of the separation structure 141 described in FIGS. 1 to 3 will be described with reference to FIG. 4. FIG. 4 is an enlarged cross-sectional diagram corresponding to the cross-sectional structure in FIG. 2C, and may illustrate a separation structure which may replace the separation structure 141 in FIG. 2C. Therefore, a modified portion of the separation structure 141 in FIG. 2C will be mainly described with reference to FIG. 4.

In the modified example, referring to FIG. 4, as described in FIG. 2C, the separation structure 141a may include a lower separation pattern 115a and an upper separation pattern 138a on the lower separation pattern 115a. In the separation structure 141a, an upper surface SR' of the lower separation pattern 115a disposed in the second substrate 106 may have a wavy or sawtooth shape in which concave portions P1b' and convex portions P1a may be alternately arranged in the first horizontal direction Y. The lower separation pattern 115a may have a minimum vertical length D1b' in the line regions 141ia (in FIGS. 1 and 4), and may have a maximum vertical length D1a in the intersecting regions 141ca (in FIGS. 1 and 4). The upper separation pattern 138a may have a maximum vertical length D2b' in the line regions 141ia (in FIGS. 1 and 4), and may have a minimum vertical length D2a in the intersecting regions 141ca (in FIGS. 1 and 4).

In the concave portion P1b' and the convex portion P1a adjacent to each other among the concave portions P1b' and the convex portions P1a, a level difference D3' between a lowermost end of the concave portion P1b' and an uppermost end of the convex portion P1a may be greater than the minimum vertical length D2a of the upper separation pattern 138a. In the upper separation pattern 138a, the minimum vertical length D2a may be the same as a distance between the uppermost end of the convex portion P1a and the second surface 106s2 of the second substrate 106.

Figure 5A:
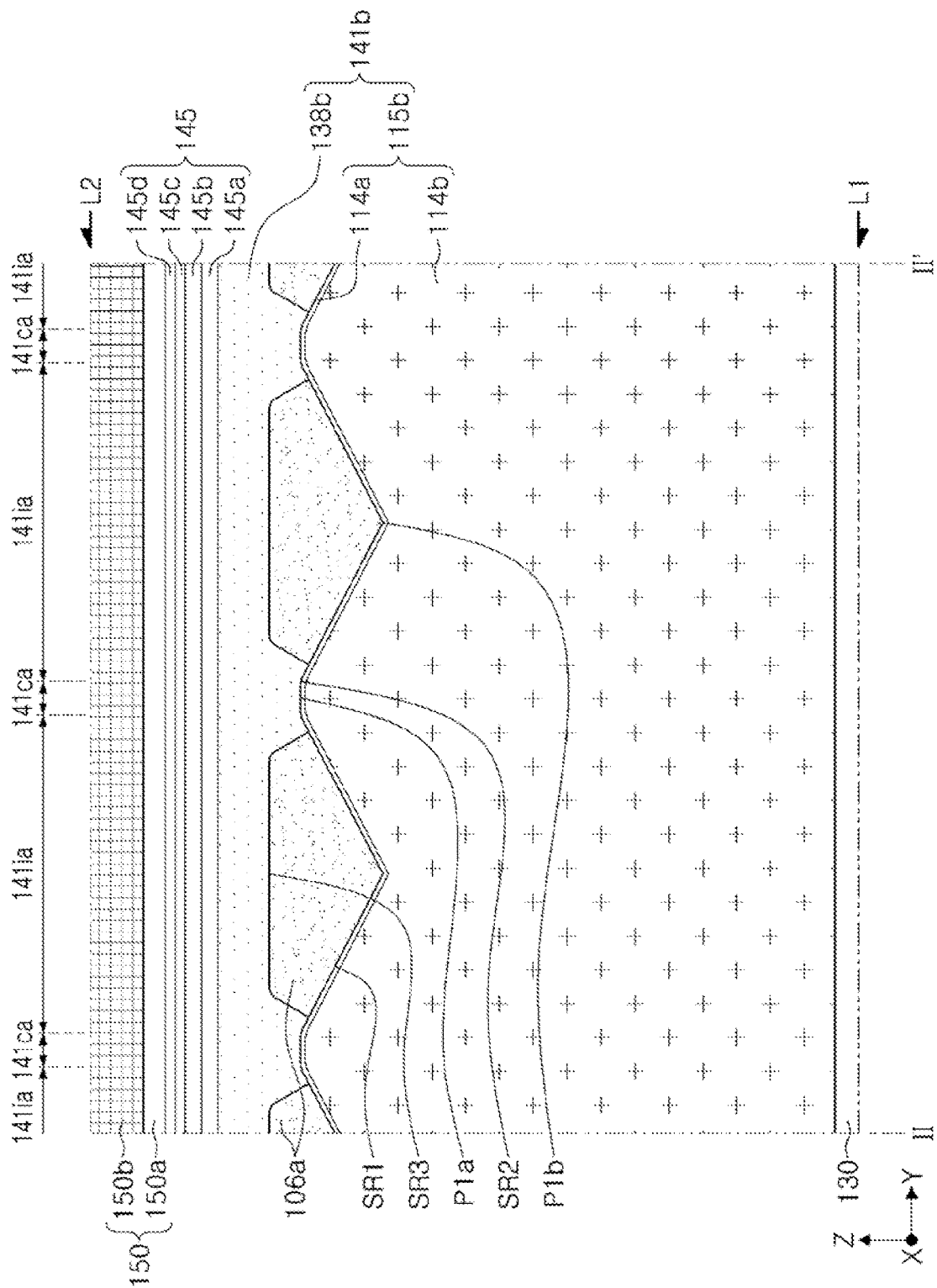
FIG. 5A is an enlarged cross-sectional diagram illustrating a modified example of an image sensor, illustrating a portion of the image sensor.
Figure 5B:
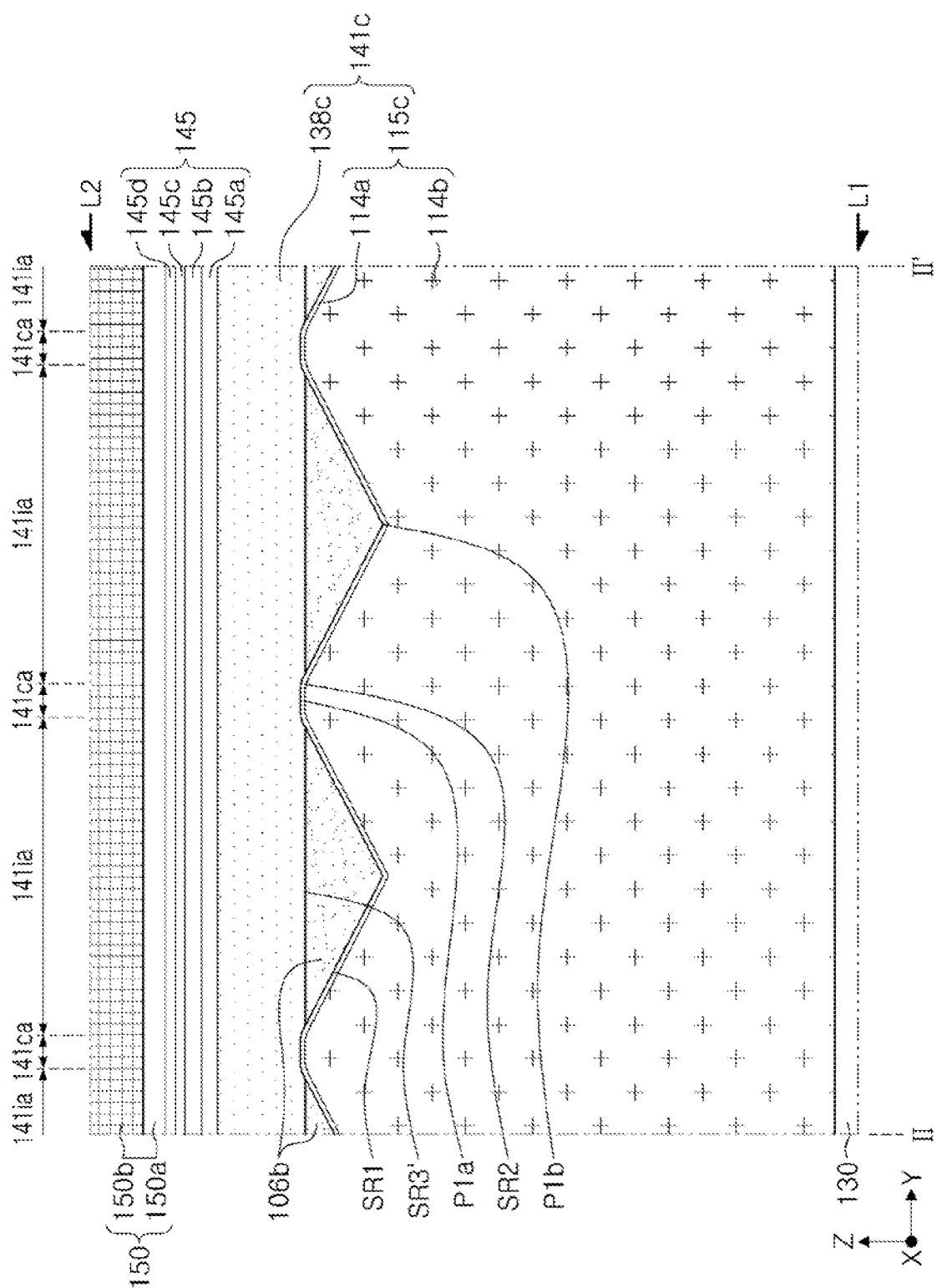
FIG. 5B is an enlarged cross-sectional diagram illustrating a modified example of an image sensor, illustrating a portion of the image sensor.
Figure 5C:
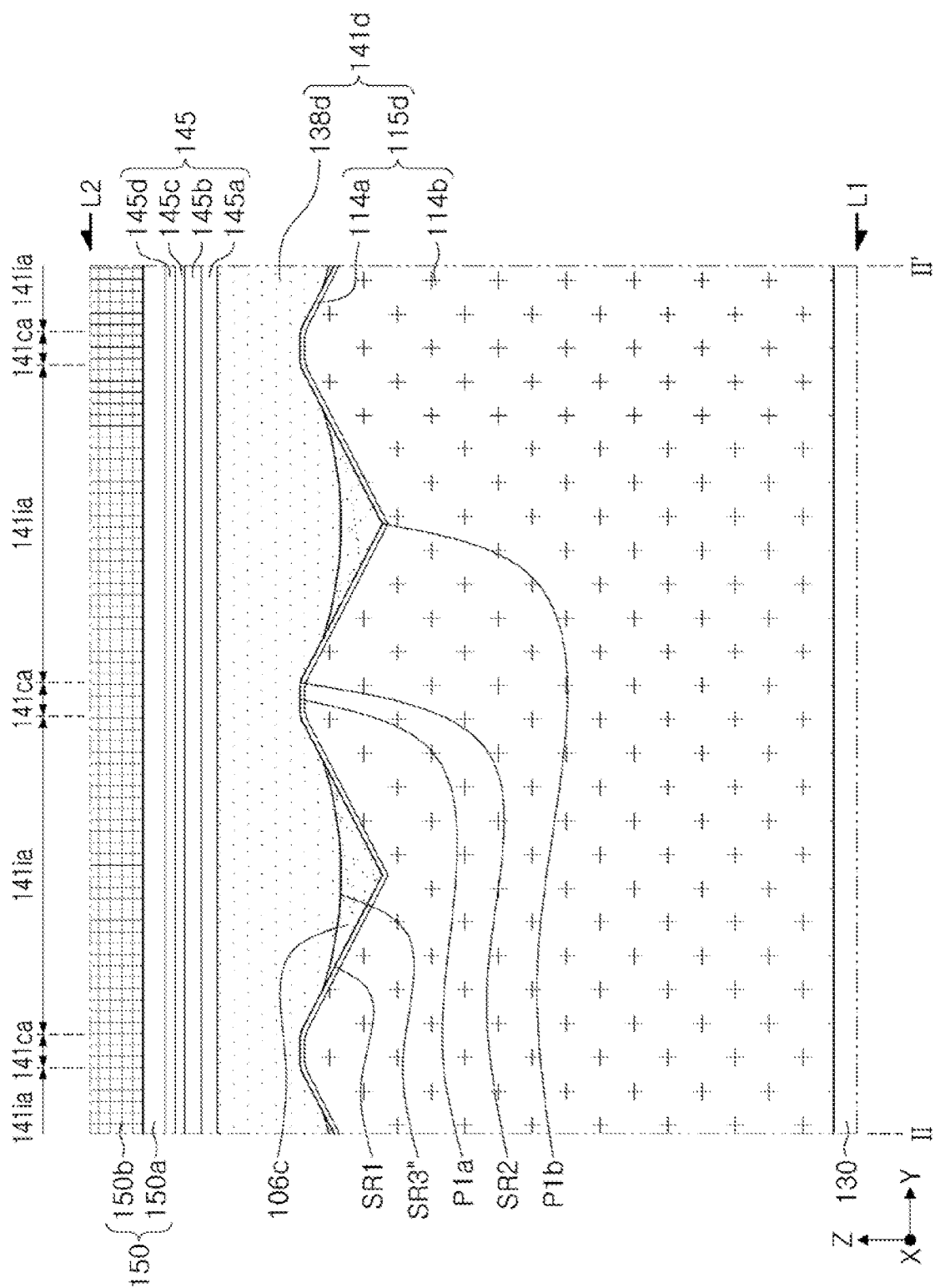
FIG. 5C is an enlarged cross-sectional diagram illustrating a modified example of an image sensor, illustrating a portion of the image sensor.

A modified example of the image sensor 1 will be described with reference to FIGS. 5A to 5C. FIGS. 5A to 5C are enlarged cross-sectional diagrams corresponding to the cross-sectional structure in FIG. 2C.

In the modified example, referring to FIG. 5A along with FIGS. 1 to 2B, an image sensor 1 may include a separation structure 141b which may replace the separation structure 141 in FIG. 2C. The separation structure 141b may include a lower separation pattern 115b and an upper separation pattern 138b on the lower separation pattern 115b. The lower separation pattern 115b may have the same cross-sectional structure as that of the lower separation pattern 115 in FIG. 2C or the lower separation pattern 115 in FIG. 4. For example, in the separation structure 141b, upper surfaces SR1 and SR2 of the lower separation pattern 115b disposed in the second substrate 106 may have a wavy or sawtooth shape in which concave portions P1b and convex portions P1a may be alternately arranged in the first horizontal direction Y. The upper surfaces SR1 and SR2 of the lower separation pattern 115b may have a first upper surface SR1 spaced apart from the upper separation pattern 138b and a second upper surface SR2 in contact with the upper separation pattern 138b. In the separation structure 141b, the lower surfaces SR3 and SR2 of the upper separation pattern 138b disposed in the second substrate 106 may have a first lower surface SR3 spaced apart from the lower separation pattern 115b and a second lower surface SR2 in contact with the lower separation pattern 115b. The second upper surface SR2 of the lower separation pattern 115b may be in contact with the second lower surface SR2 of the upper separation pattern 138b. Since the second upper surface SR2 of the lower separation pattern 115b and the second lower surface SR2 of the upper separation pattern 138b are in contact with each other, the elements may be indicated by a single reference numeral "SR2."

The first upper surface SR1 of the lower separation pattern 115b may be an upper surface including the concave portions P1b, and the second upper surface SR2 of the lower separation pattern 115b may be an upper surface including the convex portions P1a.

The image sensor 1 may further include a semiconductor region 106a disposed between the first upper surface SR1 of the lower separation pattern 115b and the first lower surface SR3 of the upper separation pattern 138b. The semiconductor region 106a may be in contact with the first upper surface SR1 of the lower separation pattern 115b and the first lower surface SR3 of the upper separation pattern 138b. The semiconductor region 106a may include the same material as a semiconductor material of the second substrate 106, such as single crystal silicon, for example.

The upper surface of the semiconductor region 106a may be disposed on a level higher than a level of upper ends of the convex portions P1a of the upper surfaces SR1 and SR2 of the lower separation pattern 115b.

In the modified example, referring to FIG. 5B along with FIGS. 1 to 2B, an image sensor 1 may include a separation structure 141c which may replace the separation structure 141b in FIG. 5A. For example, the separation structure 141c may include a lower separation pattern 115c having substantially the same structure as that of the lower separation pattern 115b in FIG. 5A, and may include an upper separation pattern 138c which may replace the upper separation pattern 138b in FIG. 5A. For example, in the separation structure 141c, lower surfaces SR3' and SR2 of the upper separation pattern 138c disposed in the second substrate 106 may have a first lower surface SR3' spaced apart from the lower separation pattern 115c and a second lower surface SR2 in contact with the lower separation pattern 115c, and the first lower surface SR3' of the upper separation pattern 138c may have a substantially flat shape. As in FIG. 5A, the image sensor 1 may further include a semiconductor region 106b disposed between the first upper surface SR1 of the lower separation pattern 115c and the first lower surface SR3' of the upper separation pattern 138c. The upper surface of the semiconductor region 106c in contact with the first lower surface SR3' of the upper separation pattern 138c may have a substantially flat (e.g., planar) shape.

In the modified example, referring to FIG. 5C along with FIGS. 1 to 2B, an image sensor 1 may include a separation structure 141d which may replace the separation structure 141c in FIG. 5B. For example, the separation structure 141d may include a lower separation pattern 115d which may be substantially the same as the lower separation pattern 115c in FIG. 5B, and may include an upper separation pattern 138d which may replace the upper separation pattern 138c in FIG. 5B. For example, in the separation structure 141d, the lower surfaces SR3" and SR2 of the upper separation pattern 138d disposed in the second substrate 106 may have a first lower surface SR3" spaced apart from the lower separation pattern 115d and a second lower surface SR2 in contact with the lower separation pattern 115d. The first lower surface SR3" of the upper separation pattern 138d may be curved downwardly and may be bent.

As in FIG. 5A, the image sensor 1 may further include a semiconductor region 106c disposed between the first upper surface SR1 of the lower separation pattern 115d and the first lower surface SR3" of the upper separation pattern 138d. The upper surface of the semiconductor region 106c in contact with the first lower surface SR3" of the upper separation pattern 138d may be concave.

Figure 6A:
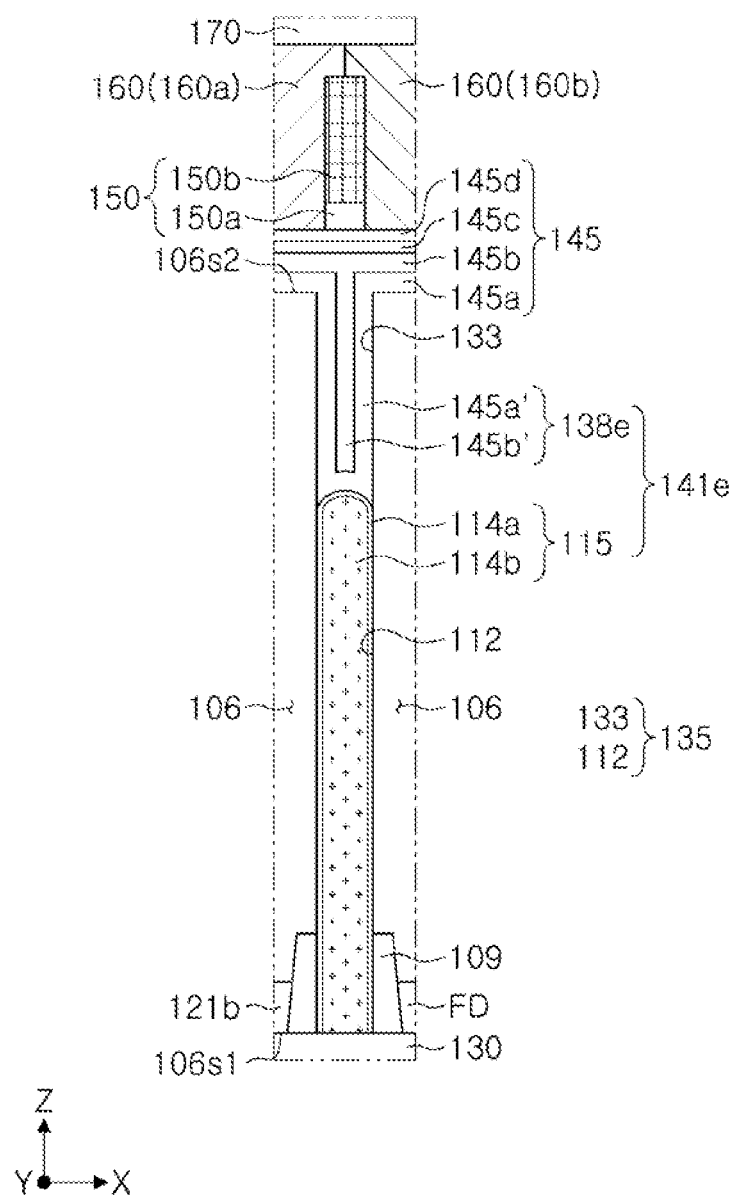
FIG. 6A is an enlarged cross-sectional diagram illustrating a modified example of an image sensor, illustrating a portion of the image sensor.

In the description below, a modified example of the insulating structure 145 and the upper separation pattern 138 of the separation structure 141 described above will be described with reference to FIG. 6A. FIG. 6A is an enlarged cross-sectional diagram corresponding to FIG. 2B, and may illustrate a modified example of the insulating structure 145 and the upper separation pattern 138 illustrated in FIG. 2B.

In the modified example, referring to FIG. 6A along with FIGS. 1 and 2A, the upper separation pattern 138 illustrated in FIG. 2B may be formed by extending at least a portion of the plurality of layers 145a, 145b, 145c, and 145d of the insulating structure 145 in FIG. 2B. Accordingly, at least a portion of the plurality of layers 145a, 145b, 145c, and 145d of the insulating structure 145 may be part of a single unified structure with the upper separation pattern 138e. For example, among the plurality of layers 145a, 145b, 145c, and 145d of the insulating structure 145, the first and second layers 145a and 145b may fill the upper separation trench 133 described above. The portions 145a' and 145b' filling the upper separation trench 133 by extending the first and second layers 145a and 145b of the plurality of layers 145a, 145b, 145c, and 145d of the insulating structure 145 into the upper separation trench 133 may form the upper separation pattern 138e.

The cross-sectional structure of the separation structure 141e may be modified to be the same as one of the separation structures described with reference to FIGS. 2C, 4, and 5A to 5C.

Figure 6B:
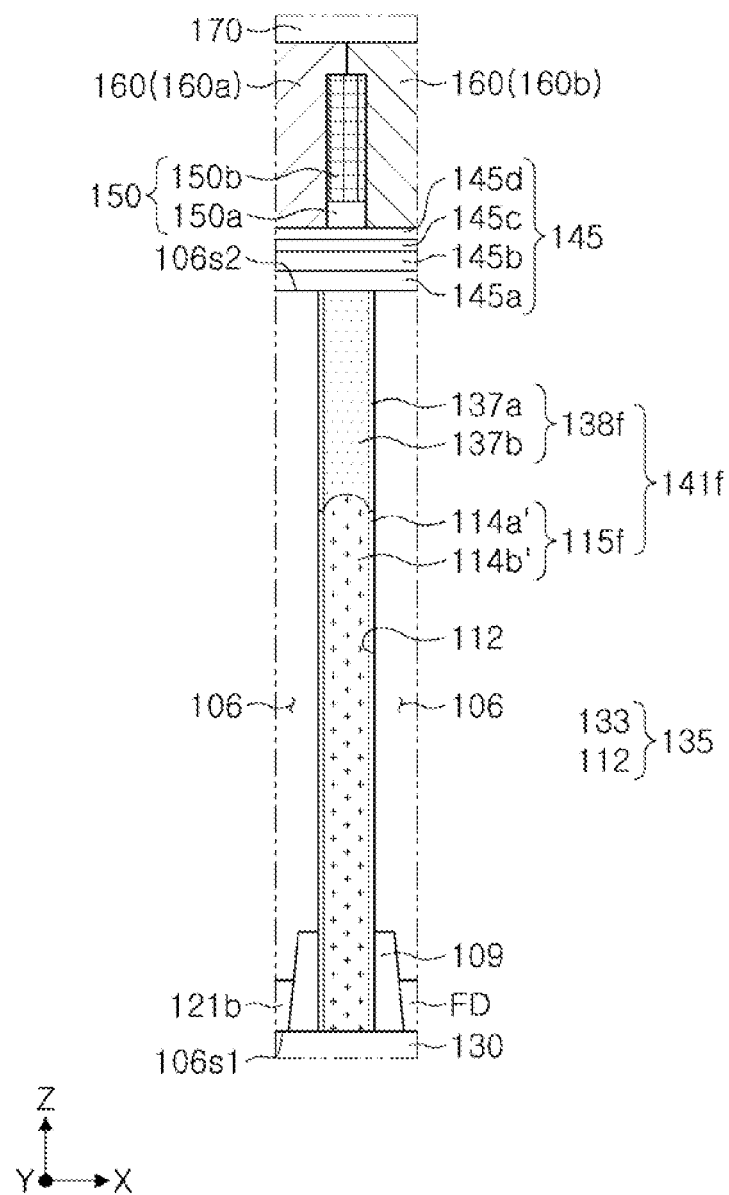
FIG. 6B is an enlarged cross-sectional diagram illustrating a modified example of an image sensor, illustrating a portion of the image sensor.

In the description below, a modified example of the upper separation pattern 138 of the separation structure 141 described above will be described with reference to FIG. 6B. FIG. 6B is an enlarged cross-sectional diagram corresponding to FIG. 2B, and may illustrate a modified example of the separation structure 141 illustrated in FIG. 2B.

In the modified example, referring to FIG. 6B along with FIGS. 1 and 2A, the upper separation pattern 138 illustrated in FIG. 2B may be replaced with an upper separation pattern 138f including an upper material pattern 137b and an upper material layer 137a covering a side surface of the upper material pattern 137b. The lower separation pattern 115 illustrated in FIG. 2B may be replaced with a lower separation pattern 115f including a lower material pattern 114b' in contact with the upper material pattern 137b and a lower material layer 114a covering the side surfaces of the lower material pattern 114b'. Accordingly, the separation structure 141 in FIG. 2B may be replaced with a separation structure 141f including the lower separation pattern 115f and the upper separation pattern 138f. The lower material pattern 114b' and/or the upper material pattern 137b may include polysilicon. The lower material layer 114a' and/or the upper material layer 137a may include silicon oxide and/or a high-k dielectric material. For example, the lower material layer 114a' and the upper material layer 137a may include silicon oxide.

The cross-sectional structure of the separation structure 141f may be modified to be the same as one of the separation structures described in FIGS. 2C, 4, and 5A to 5C.

Figure 7:
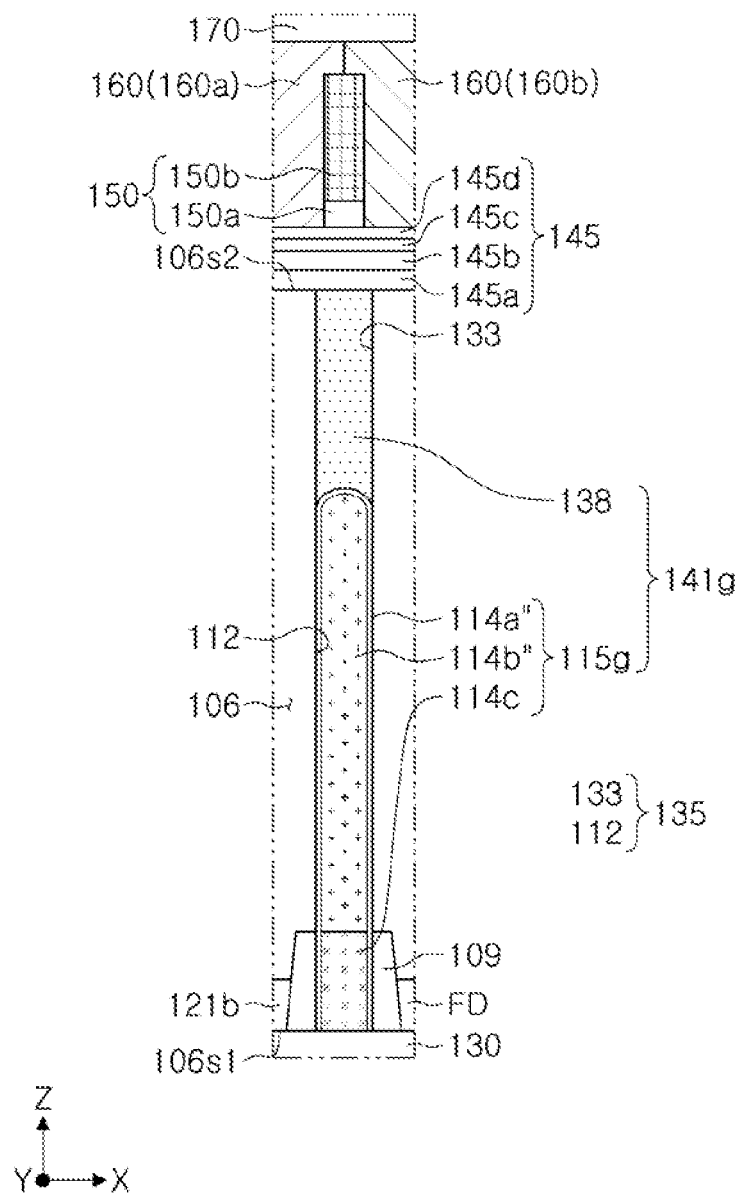
FIG. 7 is an enlarged cross-sectional diagram illustrating a modified example of an image sensor, illustrating a portion of the image sensor.

In the description below, a modified example of the lower separation pattern 115 of the separation structure 141 described above will be described with reference to FIG. 7. FIG. 7 is an enlarged cross-sectional diagram corresponding to FIG. 2B, and may illustrate a modified example of the separation structure 141 illustrated in FIG. 2B.

In the modified example, referring to FIG. 7 along with FIGS. 1 and 2A, the lower separation pattern 115 illustrated in FIG. 2B may be replaced with a lower separation pattern 115g including a first lower material pattern 114b", a lower material layer 114a" covering at least the side surface of the first lower material pattern 114b", and a second lower material pattern 114c disposed below the first lower material pattern 114b". Accordingly, the separation structure 141 illustrated in FIG. 2B may be replaced with a separation structure 141g including the lower separation pattern 115g along with the upper separation pattern 138.

The lower surface of the second lower material pattern 114c may be coplanar with the first surface 106s1 of the second substrate 106.

The first and second lower material patterns 114b" and 114c may have the same cross-sectional structure as that of the lower material pattern described above, the lower material pattern 114b in FIG. 2B, for example.

The vertical length of the first lower material pattern 114b" may be greater than the vertical length of the second lower material pattern 114c.

The first and second lower material patterns 114b" and 114c may include different materials. For example, the first lower material pattern 114b" may include polysilicon, and the second lower material pattern 114c may include an insulating material. For example, the second lower material pattern 114c may include silicon oxide and/or a high-k dielectric material.

The cross-sectional structure of the separation structure 141g may be modified to be the same as one of the separation structures described in FIGS. 2C, 4, and 5A to 5C.

Figure 8A:
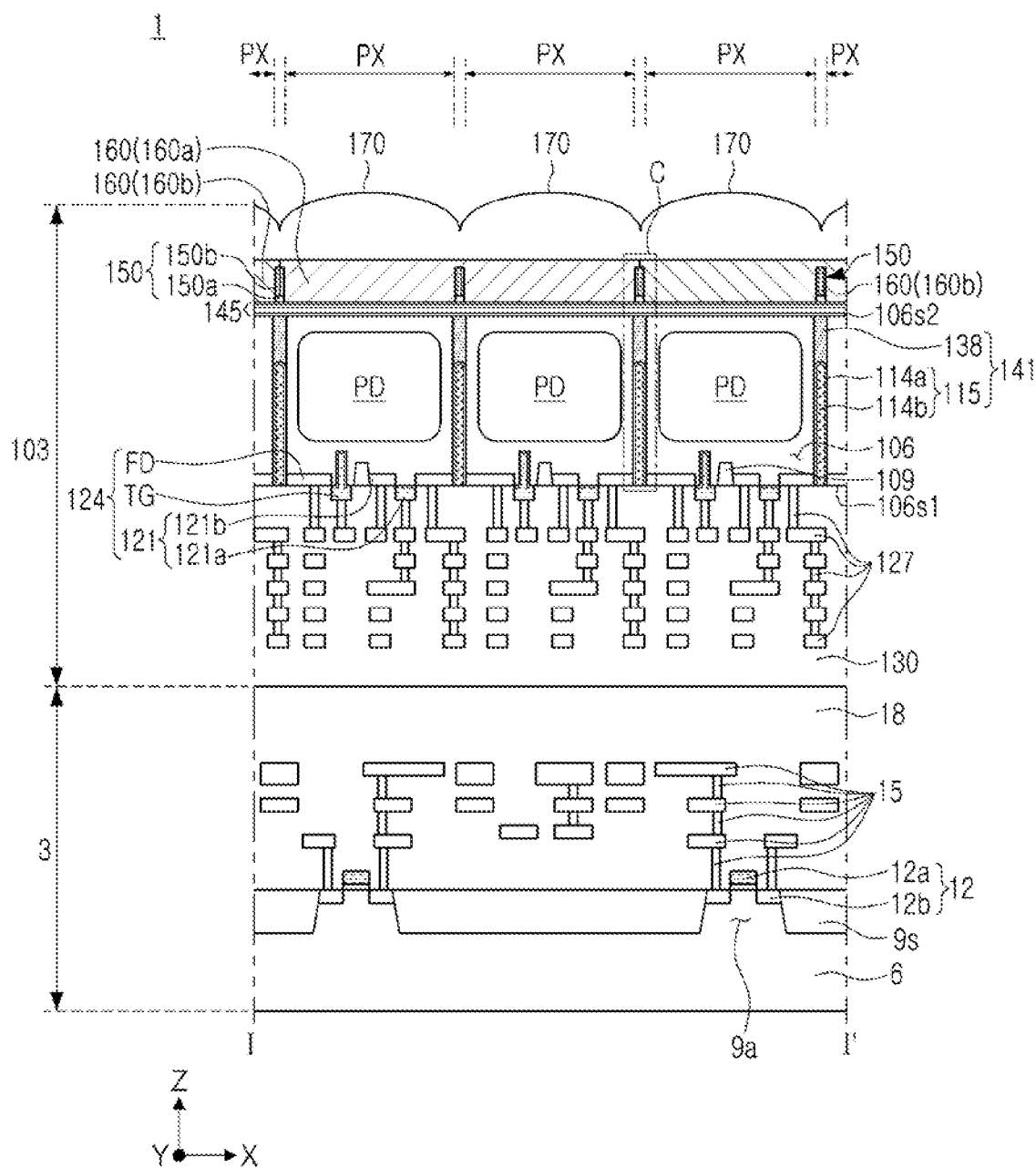
FIGS. 8A and 8B are cross-sectional diagrams illustrating a modified example of an image sensor.

In the description below, a modified example of the image sensor 1 in an example embodiment will be described with reference to FIGS. 8A and 8B. FIG. 8A may be a cross-sectional diagram illustrating a cross-sectional structure corresponding to the cross-sectional structure in FIG. 2A, and FIG. 8B is an enlarged diagram illustrating portion "C" in FIG. 8, and may be a cross-sectional diagram illustrating a cross-sectional structure corresponding to the cross-sectional structure in FIG. 2B.

Figure 8B:
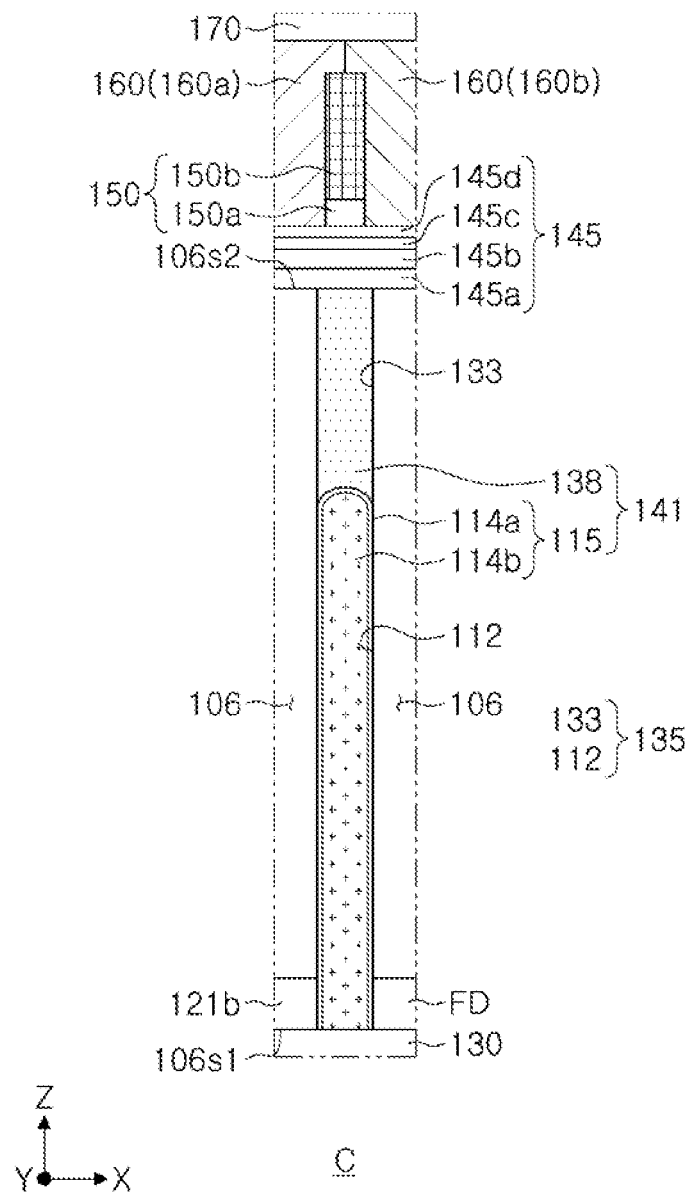

In the modified example, referring to FIGS. 8A and 8B, among the isolation layers 109 in FIGS. 2A and 2B, the isolation layer 109 (in FIGS. 2A and 2B) in contact with the lower separation pattern 115 of the separation structure 141 in FIGS. 2A and 2B might not be provided, and the other isolation layer 109 may remain. Accordingly, the separation structure 141 may be spaced apart from the isolation layer 109 and may penetrate the second substrate 106.

Figure 9A:
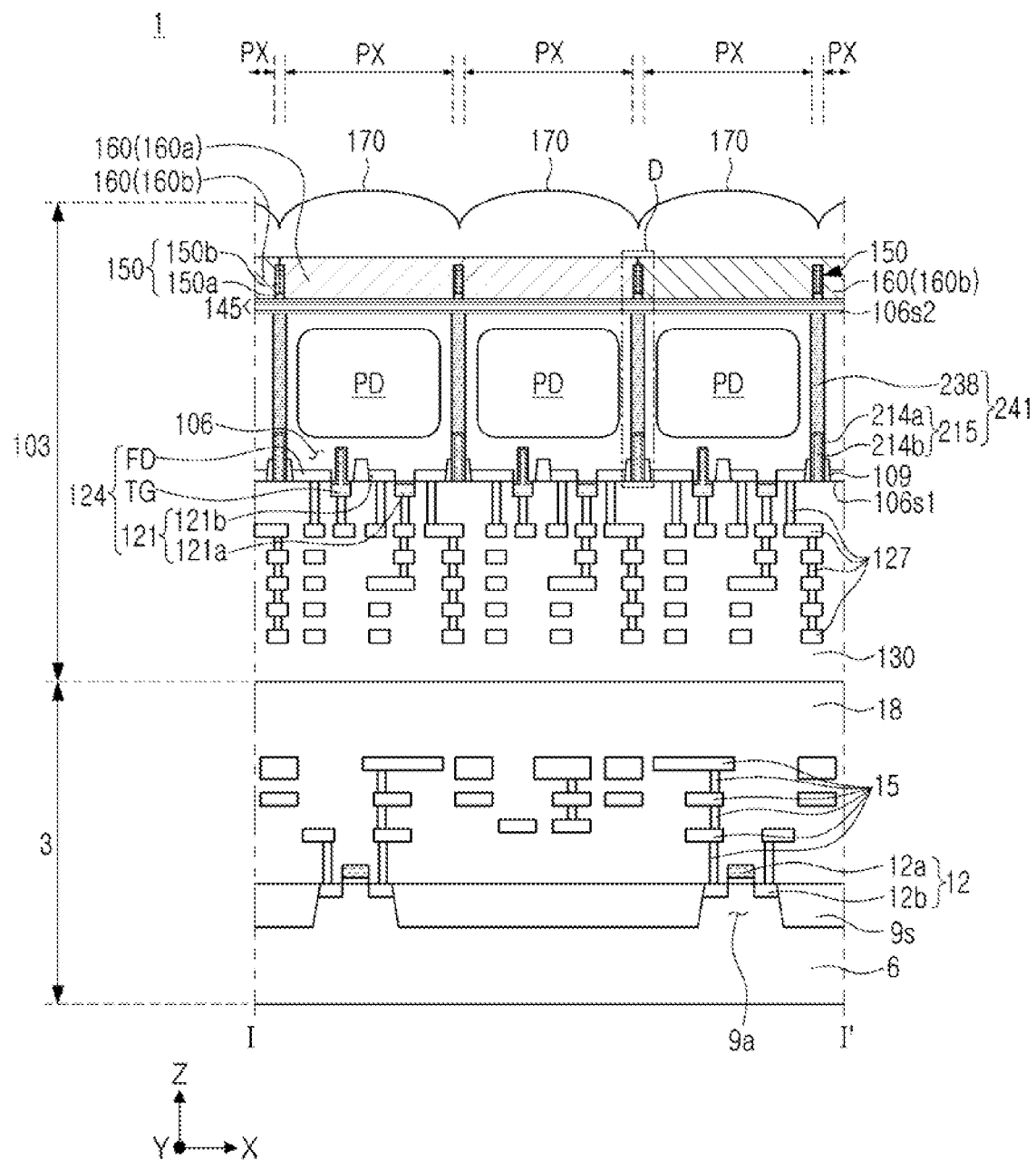
FIGS. 9A to 9C are cross-sectional diagrams illustrating a modified example of an image sensor.
Figure 9B:
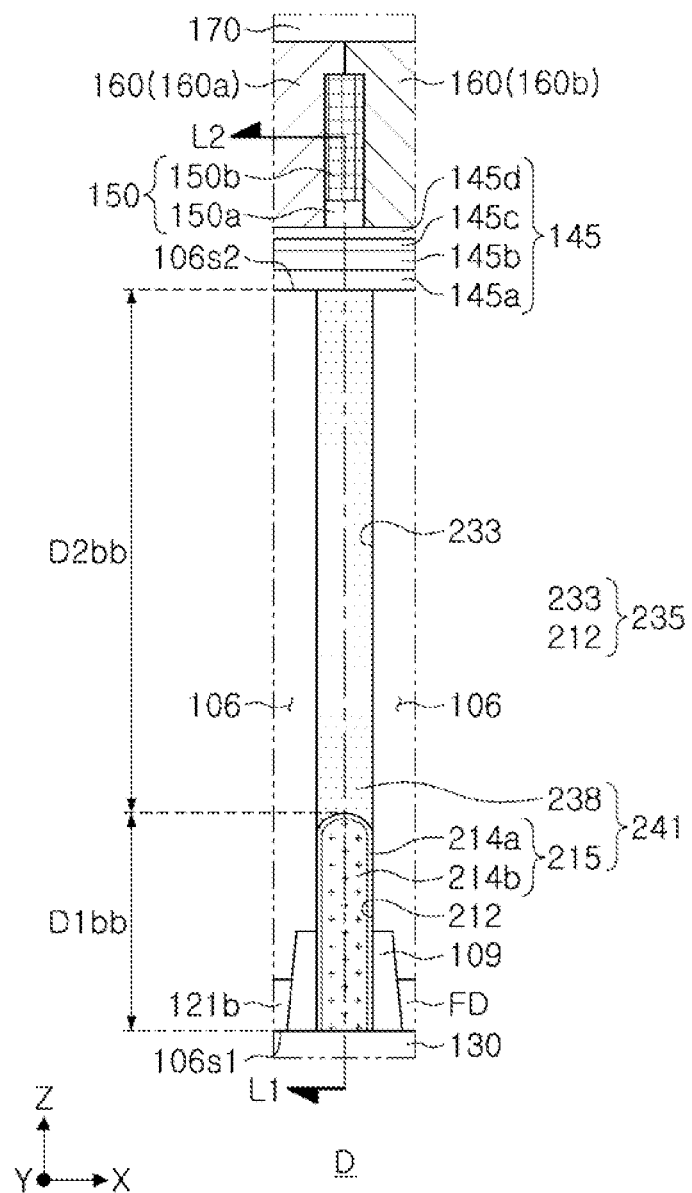
Figure 9C:
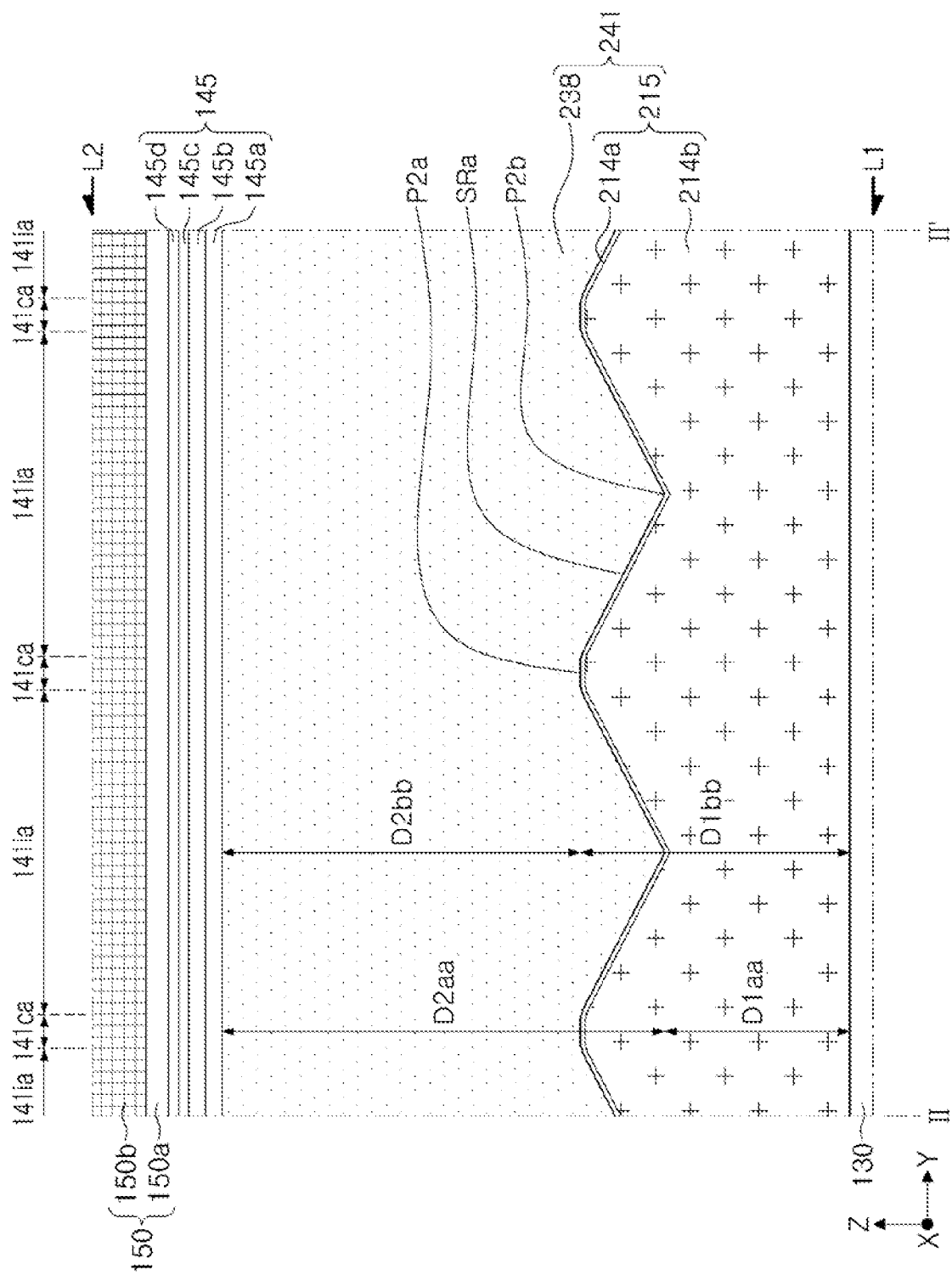

In the description below, a modified example of the image sensor 1 in an example embodiment will be described with reference to FIGS. 9A, 9B and 9C. FIG. 9A may be a cross-sectional diagram illustrating a cross-sectional structure corresponding to the cross-sectional structure in FIG. 2A, and FIG. 9B is an enlarged diagram of portion "D" in FIG. 9A, and may illustrate a cross-sectional structure corresponding to the cross-sectional structure in FIG. 2B. FIG. 9C may be a cross-sectional diagram illustrating a cross-sectional structure corresponding to the cross-sectional structure in FIG. 2C.

In the modified example, referring to FIGS. 9A to 9C along with FIG. 1, the separation structure 241 may include a lower separation pattern 215 which may replace the lower separation pattern 115 described in FIGS. 2A and 2B, and an upper separation pattern 238 which may replace the upper separation pattern 138 described in FIGS. 2A and 2B. The separation structure 241 may be disposed in the separation trench 235 penetrating the second substrate 106. In the separation structure 241, the lower separation pattern 215 may be disposed in the lower separation trench 212, and the upper separation pattern 238 may be disposed in the upper separation trench 233.

The planar shape of the separation structure 241 may be the same as the planar shape of the separation structure 141 in FIG. 1. Accordingly, the separation structure 241 may include the first and second line portions 141_1 and 141_2 described in FIG. 1, and may include the line regions 141ia and the intersecting regions 141ca described in FIG. 1.

In an example, the lower surface of the lower separation pattern 215 may be coplanar with the first surface 106s1 of the second substrate 106, and the upper surface of the upper separation pattern 238 may be coplanar with the second surface 106s2 of the second substrate 106.

In an example, at least a portion of the upper surface SRa of the lower separation pattern 215 may be in contact with at least a portion of the lower surface of the upper separation pattern 238.

A cross-sectional structure obtained by cutting one of the first line portions 141_1 (in FIG. 1) of the separation structure 241 in the first horizontal direction Y, the cross-sectional structure as in FIG. 9C, for example, the upper surface SRa of the lower separation pattern 215 disposed in the second substrate 106 and/or the lower surface of the upper separation pattern 238 may have a wavy or sawtooth shape in which concave portions and convex portions may be alternately arranged in the first horizontal direction Y. For example, the upper surface SRa of the lower separation pattern 215 may have a wavy or sawtooth shape in which concave portions P2b and convex portions P2a may be alternately arranged in the first horizontal direction Y.

In an example, upper ends of the convex portions P2a of the upper surface SRa of the lower separation pattern 215 may be disposed in the intersecting regions 141ca, and lower ends of the concave portions P2b of the upper surface SRa of the lower separation pattern 215 may be disposed in the line regions 141ia.

In an example, a cross-sectional structure obtained by cutting one of the first line portions 141_1 of the separation structure 141 along the second horizontal direction X, in the cross-sectional structure as illustrated in FIG. 9B, for example, the upper surface of the lower separation pattern 215 may be concave.

In an example, in the intersecting regions 141ca (in FIGS. 1 and 9C) in which the first line portions 141_1 (in FIG. 1) and the second line portions 141_2 (in FIG. 1) intersect each other, the vertical length D2aa of the upper separation pattern 238 may be about 2 times to about 10 times greater than the vertical length D1aa of the lower separation pattern 215.

In an example, in the intersecting regions 141ca, the vertical length D2aa of the upper separation pattern 238 may be about 3 times to about 9 times greater than the vertical length D1aa of the lower separation pattern 215.

In an example, in the intersecting regions 141ca, the vertical length D2aa of the upper separation pattern 238 may be about 1.5 μm to about 10 μm.

In an example, in the intersecting regions 141ca, the vertical length D2aa of the upper separation pattern 238 may be about 2 μm to about 9 μm.

In an example, the lower separation pattern 215 may have a minimum vertical length D1bb in the line regions 141ia (in FIGS. 1 and 9C), and may have a maximum vertical length D1aa in the intersecting regions 141ca (FIGS. 1 and 9C).

In an example, the upper separation pattern 238 may have a maximum vertical length D2bb in the line regions 141ia (in FIGS. 1 and 9C), and may have a minimum vertical length D2aa in the intersecting regions 141ca (FIGS. 1 and 9C).

In an example, the lower separation pattern 215 may include a lower material pattern 214b and a lower material layer 214a covering at least a side surface of the lower material pattern 214b. The lower material layer 214a may surround a side surface of the lower material pattern 214b and may cover an upper surface of the lower material pattern 114b. The lower material pattern 214b may include polysilicon, and the lower material layer 214a may include an insulating material. For example, the lower material layer 214a may include silicon oxide and/or a high-k dielectric material. In an example, the upper separation pattern 238 may include an insulating material. For example, the upper separation pattern 238 may include silicon oxide. In an example, the upper separation pattern 238 may include a plurality of insulating layers including a silicon oxide layer and a high-k dielectric layer.

In an example, when viewed with reference to the first surface 106s1 of the second substrate 106, the upper surface SRa of the lower separation pattern 215 disposed in the second substrate 106 may be disposed on a level higher than a level of the upper surface of the isolation layer 109 disposed in the second substrate 106.

Figure 10A:
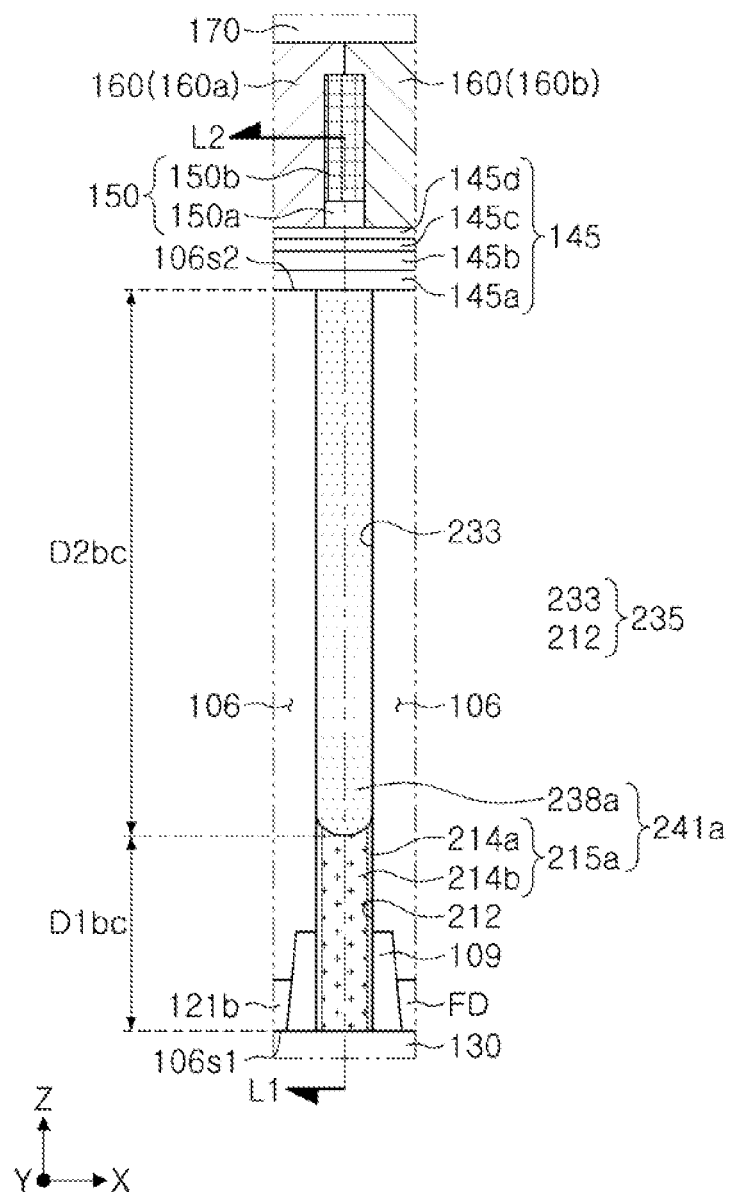
FIGS. 10A and 10B are enlarged cross-sectional diagrams illustrating a modified example of an image sensor, illustrating a portion of the image sensor.

In the description below, a modified example of the separation structure 241 will be described with reference to FIGS. 10A and 10B. FIG. 10A may be a cross-sectional diagram illustrating a cross-sectional structure corresponding to the cross-sectional structure in FIG. 9B, and FIG. 10B may be a cross-sectional diagram illustrating a cross-sectional structure corresponding to the cross-sectional structure in FIG. 9C.

Figure 10B:
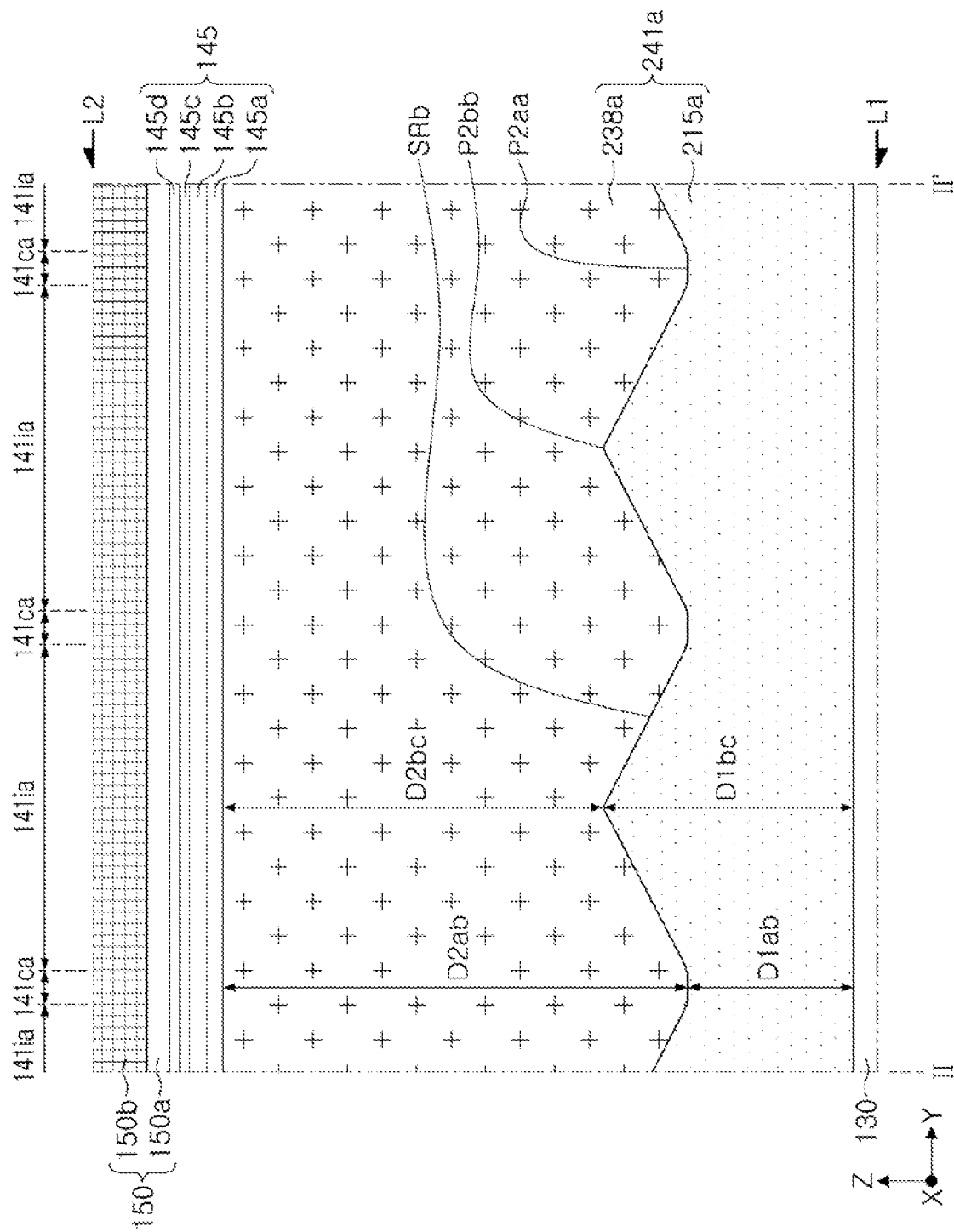

In the modified example, referring to FIGS. 10A and 10B, the separation structure 241a may include lower separation pattern 215a which may replace the lower separation pattern 215 described in FIGS. 9B and 9C and an upper separation pattern 238a which may replace the upper separation pattern 238 described in FIGS. 9B and 9C.

The planar shape of the separation structure 241a may be the same as the planar shape of the separation structure 141 described in FIG. 1. Accordingly, the separation structure 241a may include the first and second line portions 141_1 and 141_2 (in FIG. 1) described in FIG. 1, and the line regions 141ia and the intersecting regions 141ca described in FIG. 1.

The lower separation pattern 215a may include a lower material pattern 214b and a lower material layer 214a covering a side surface of the lower material pattern 214b, and the upper separation pattern 238a may be in contact with at least the lower material pattern 214b. The lower material pattern 214b may include polysilicon, and the lower material layer 214a may include an insulating material. The upper separation pattern 238a may include an insulating material.

In an example, at least a portion of the upper surface SRb of the lower separation pattern 215a may be in contact with at least a portion of the lower surface of the upper separation pattern 238.

A cross-sectional structure obtained by cutting one of the first line portions 141_1 (in FIG. 1) of the separation structure 241a in the first horizontal direction Y, the cross-sectional structure as in FIG. 10B, for example, the upper surface SRb of the lower separation pattern 215a disposed in the second substrate 106 and/or the lower surface of the upper separation pattern 238a may have a wavy or sawtooth shape in which concave portions and convex portions may be alternately arranged in the first horizontal direction Y. For example, the upper surface SRb of the lower separation pattern 215a may have a wavy or sawtooth shape in which concave portions P2aa and convex portions P2bb may be alternately arranged in the first horizontal direction Y.

In an example, upper ends of the convex portions P2bb of the upper surface SRb of the lower separation pattern 215a may be disposed in the line regions 141ia, and lower ends of the concave portions P2aa of the upper surface SRb of the lower separation pattern 215a may be disposed in the intersecting regions 141ca.

In an example, a cross-sectional structure obtained by cutting one of the first line portions 141_1 of the separation structure 241a along the second horizontal direction X, in the cross-sectional structure as in FIG. 10B, for example, the upper surface of the lower separation pattern 215a may be concave.

In an example, in the intersecting regions 141ca (in FIGS. 1 and 9C) in which the first line portions 141_1 (in FIG. 1) and the second line portions 141_2 (in FIG. 1) intersect each other, the vertical length D2ab of the upper separation pattern 238a may be about 2 times to about 10 times greater than the vertical length D1ab of the lower separation pattern 215a. In an example, in the intersecting regions 141ca, the vertical length D2ab of the upper separation pattern 238a may be about 3 to about 9 times greater than the vertical length D1ab of the lower separation pattern 215a.

In an example, in the intersecting regions 141ca, the vertical length D2ab of the upper separation pattern 238a may be about 1.5 μm to about 10 μm.

In an example, in the intersecting regions 141ca, the vertical length D2ab of the upper separation pattern 238a may be about 2 μm to about 9 μm.

In an example, the lower separation pattern 215a may have a maximum vertical length D1bc in the line regions 141ia (in FIGS. 1 and 10B), and may have a minimum vertical length D1ab in the intersecting regions 141ca (in FIGS. 1 and 10B).

In an example, the upper separation pattern 238a may have a minimum vertical length D2bc in the line regions 141ia (in FIGS. 1 and 10B), and may have a maximum vertical length D2ab in the intersecting regions 141ca (in FIGS. 1 and 10B).

In an example, the lower separation pattern 215a may include a lower material pattern 214b and a lower material layer 214a covering at least a side surface of the lower material pattern 214b. The lower material layer 214a may cover a side surface of the lower material pattern 214b. The lower material pattern 214b may include polysilicon, and the lower material layer 214a may include an insulating material.

In an example, the upper separation pattern 238a may include an insulating material. For example, the upper separation pattern 238a may include silicon oxide. In an example, the upper separation pattern 238a may include a plurality of insulating layers including a silicon oxide layer and a high-k dielectric layer.

In an example, the upper separation pattern 238a may be in contact with the lower material pattern 214b.

Figure 11A:
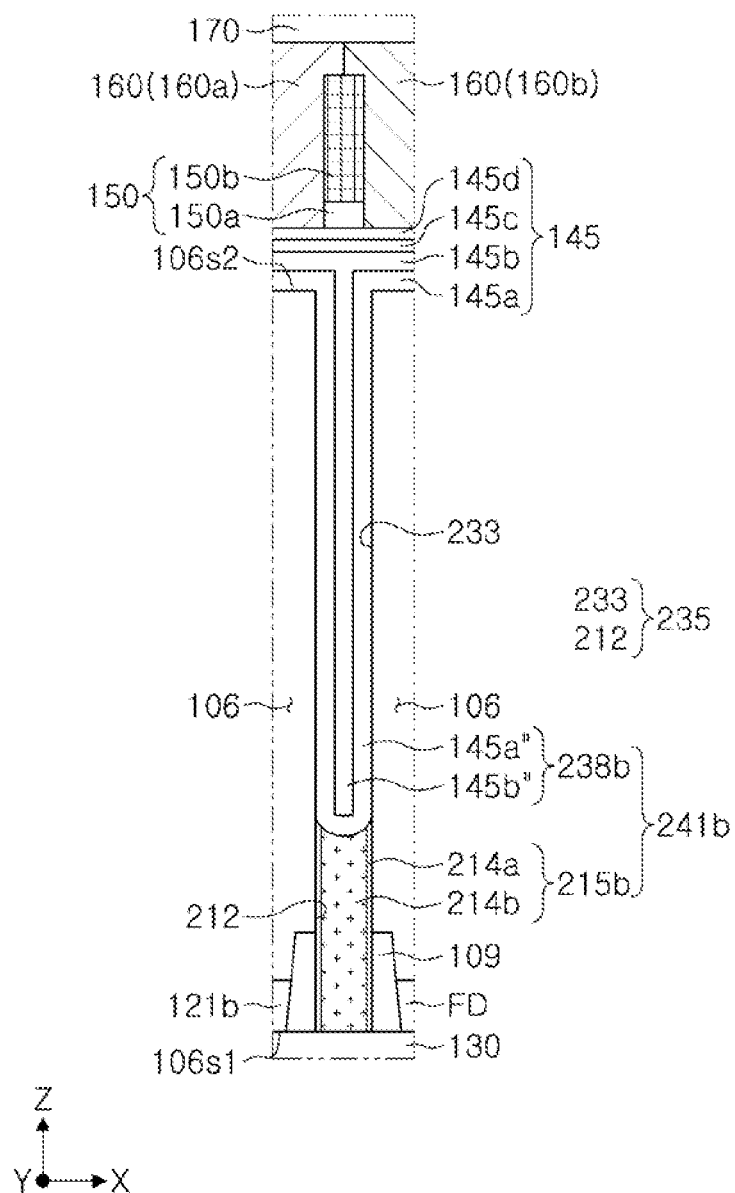
FIG. 11A is an enlarged cross-sectional diagram illustrating a modified example of an image sensor, illustrating a portion of the image sensor.

In the description below, a modified example of the upper separation pattern 238a of the separation structure 241b will be described with reference to FIG. 11A. FIG. 11A is an enlarged cross-sectional diagram corresponding to FIG. 10B, and may illustrate a modified example of the upper separation pattern 238b illustrated in FIG. 10B.

In the modified example, referring to FIG. 11A, the upper separation pattern 238a (in FIG. 10B) described in FIG. 10B may be replaced with an upper separation pattern 238b formed by extending at least a portion of the plurality of layers 145a, 145b, 145c, and 145d of the insulating structure 145 described in FIG. 2B. Accordingly, the separation structure 241b may include the upper separation pattern 238b and the lower separation pattern 215b having substantially the same structure as that of the lower separation pattern 215a in FIG. 10A.

At least a portion of the plurality of layers 145a, 145b, 145c, and 145d of the insulating structure 145 may be part of a single unified structure with the upper separation pattern 238b. The upper separation pattern 238b may include material layers 145a" and 145b" formed by extending at least a portion of the plurality of layers 145a, 145b, 145c, and 145d of the insulating structure 145, the first and second layers 145a and 145b, for example. Similarly, the upper separation pattern 238 in FIG. 9B may include a material layer formed by extending at least a portion of the plurality of layers 145a, 145b, 145c, and 145d of the insulating structure 145.

In the description below, a modified example of the upper separation pattern 238a of the separation structure 241b will be described with reference to FIG. 11B. FIG. 11A is an enlarged cross-sectional diagram corresponding to FIG. 10B, and may illustrate a modified example of the upper separation pattern 238b illustrated in FIG. 10B.

Figure 11B:
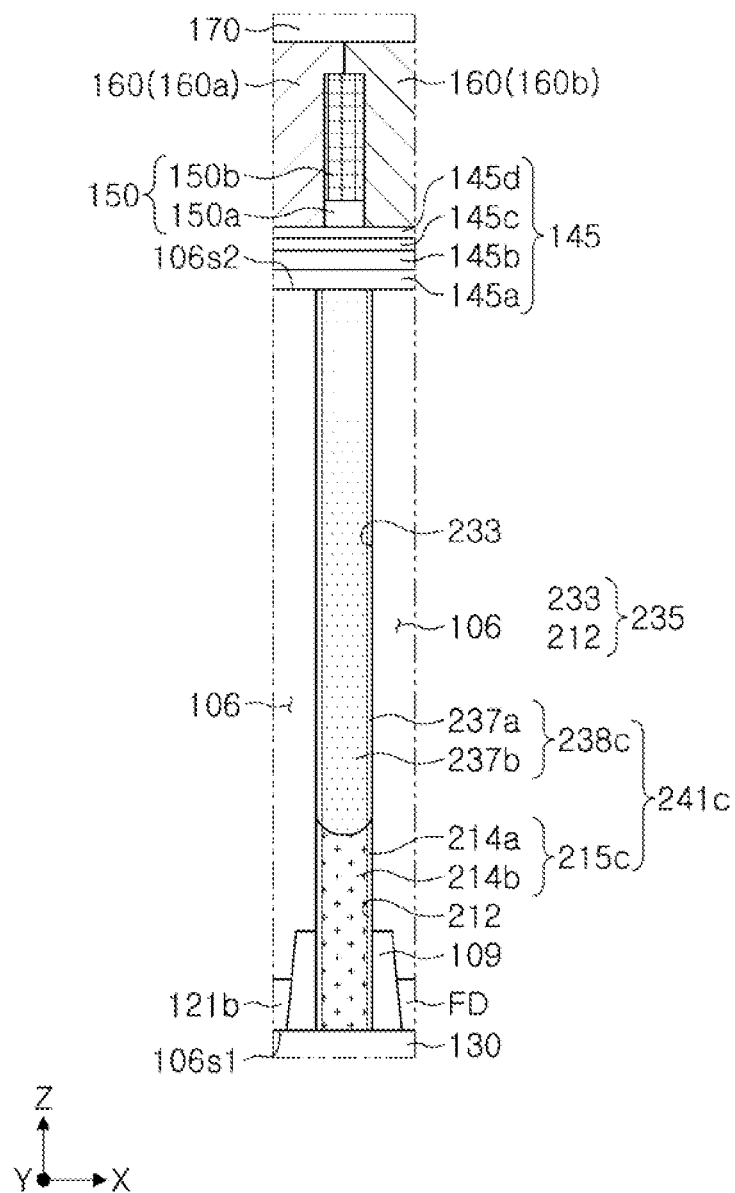
FIG. 11B is an enlarged cross-sectional diagram illustrating a modified example of an image sensor, illustrating a portion of the image sensor.

In the modified example, referring to FIG. 11B along with FIGS. 1 and 2A, the upper separation pattern 238a (in FIG. 10B) described in FIG. 10B may be replaced with an upper separation pattern 238c including an upper material pattern 237b and an upper material layer 237a covering a side surface of the upper material pattern 237b. Accordingly, the separation structure 241c may include the upper separation pattern 238c and the lower separation pattern 215c having substantially the same structure as that of the lower separation pattern 215a in FIG. 10A. The lower material pattern 214b and/or the upper material pattern 237b may include polysilicon. The lower material layer 214a and/or the upper material layer 237a may include silicon oxide and/or a high-k dielectric material.

Figure 12:
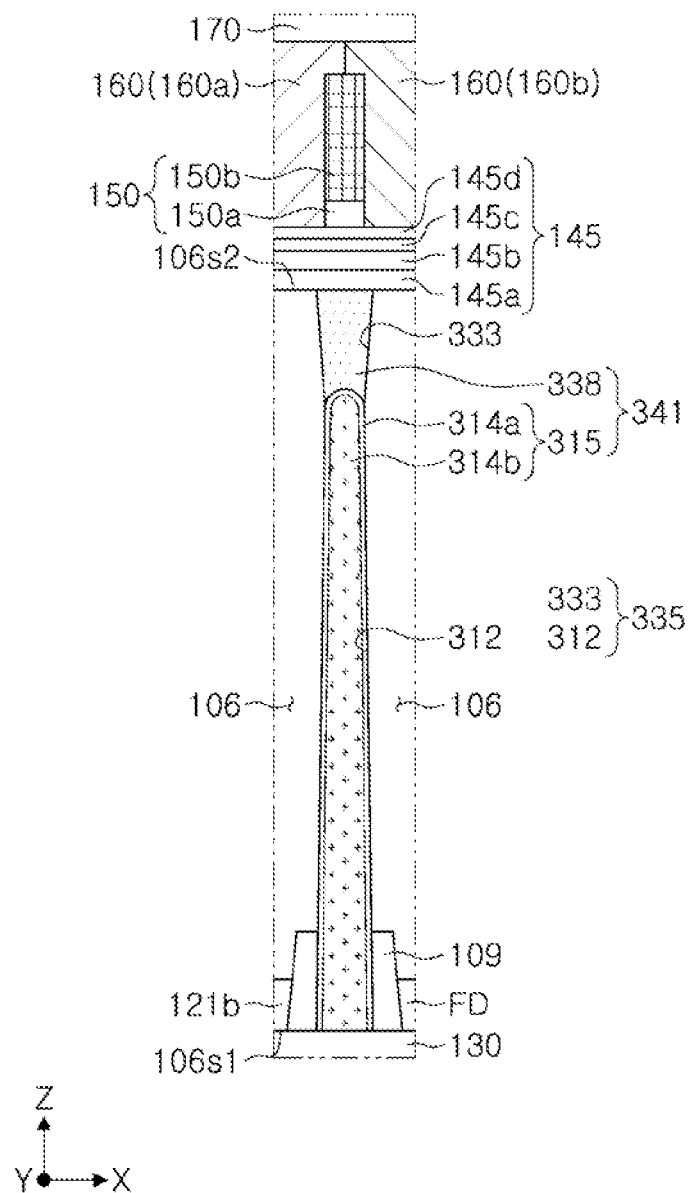
FIG. 12 is an enlarged cross-sectional diagram illustrating a modified example of an image sensor, illustrating a portion of the image sensor.
Figure 13:
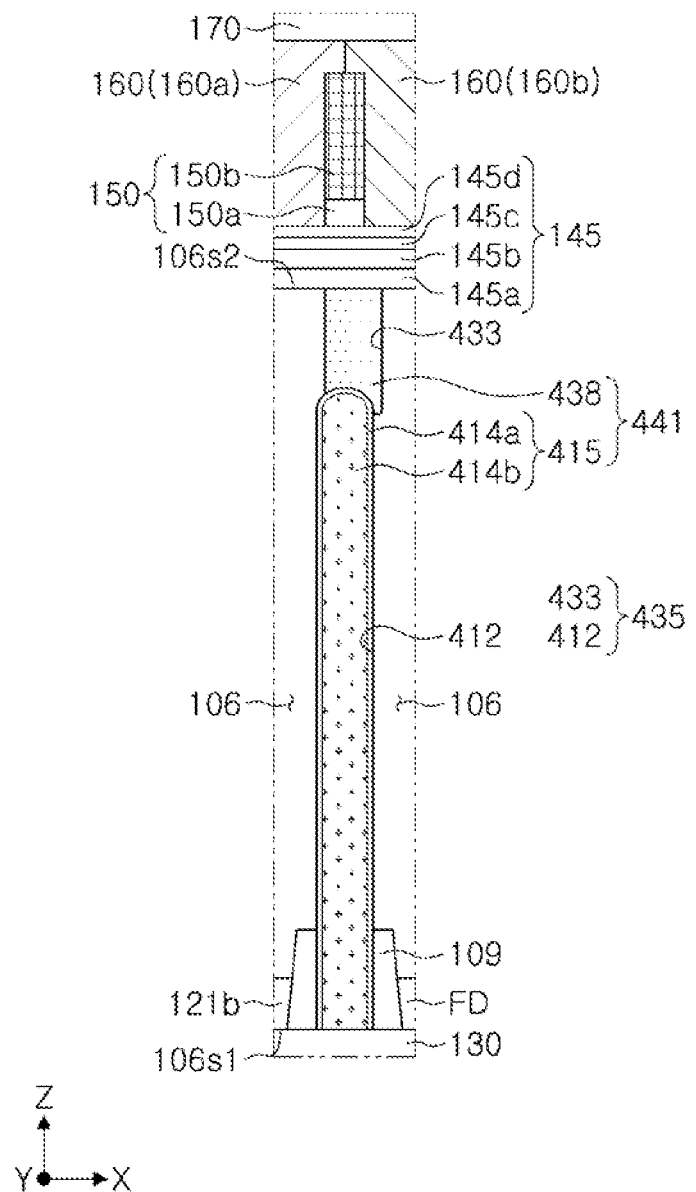
FIG. 13 is an enlarged cross-sectional diagram illustrating a modified example of an image sensor, illustrating a portion of the image sensor.

In the description below, various examples of lateral profiles of the separation structures described in the aforementioned example embodiment will be described with reference to FIGS. 12 and 13. FIGS. 12 and 13 enlarged cross-sectional diagrams illustrating a cross-sectional structure corresponding to the partially enlarged cross-sectional structure in FIG. 2B.

Referring to FIG. 12, the separation structure 341 disposed in the separation trench 335 in the second substrate 106 may include a lower separation pattern 315 which may be disposed in the lower separation trench 312, and an upper separation pattern 338 which may be disposed in the upper separation trench 333. The upper separation pattern 338 may be in contact with the lower separation pattern 315 on the lower separation pattern 315.

In an example, the lower separation pattern 315 may include a lower material pattern 314b and a lower material layer 314a covering at least a side surface of the lower material pattern 314b. The lower material pattern 314b may include polysilicon, and at least one of the lower material layers 314a may include silicon oxide and/or a high-k dielectric material.

In an example embodiment, the upper separation pattern 338 may include silicon oxide and/or a high-k dielectric material.

The lower separation pattern 315 may have an inclined side surface such that a width thereof may decrease upwardly. The upper separation pattern 338 may have an inclined side surface such that a width thereof may decrease downwardly. For example, the lower separation pattern 315 may have a side surface having a positive inclination, and the upper separation pattern 338 may have a side surface having a negative inclination.

The lower separation patterns (115 in FIGS. 2B, 6A, and 8B, 115f in FIG. 6B, 115g in FIG. 7, 215 in FIG. 9B, 215a in FIG. 10A, 215b in FIG. 11A, and 215c in FIG. 11C) described above may have a substantially vertical side surface. In an example embodiment, at least one of the lower separation patterns (115 in FIGS. 2B, 6A, and 8B, 115f in FIG. 6B, 115g in FIG. 7, 215 in FIG. 9B, 215a in FIG. 10A, 215b in FIG. 11A, and 215c in FIG. 11C) may be modified to have a side surface having a positive inclination, similarly to the lower separation pattern 315.

The upper separation patterns (138 in FIGS. 2B, 7, and 8B, 138e in FIG. 6A, 138f in FIG. 6A, 238 in FIG. 9B, 238a in FIG. 10A, 238b in FIG. 11A, and 238c in FIG. 11C) described above may have a substantially vertical side surface. In an example embodiment, at least one of the upper separation patterns (138 in FIGS. 2B, 7, and 8B, 138e in FIG. 6A, 138f in FIG. 6A, 238 in FIG. 9B, 238a in FIG. 10A, 238b in FIG. 11A, and 238c in FIG. 11C) may have a side surface having a positive inclination, similarly to the upper separation pattern 338.

Referring to FIG. 13, the separation structure 441 disposed in the separation trench 435 in the second substrate 106 may include a lower separation pattern 415 which may be disposed in the lower separation trench 412 and an upper separation pattern 438 which may be disposed in the upper separation trench 433. The upper separation pattern 438 may be in contact with the lower separation pattern 415 on the lower separation pattern 415.

In an example, the lower separation pattern 415 may include a lower material pattern 414b and a lower material layer 414a covering at least a side surface of the lower material pattern 414b. The lower material pattern 414b may include polysilicon, and at least one of the lower material layers 414a may include silicon oxide and/or a high-k dielectric material.

In an example embodiment, the upper separation pattern 438 may include silicon oxide and/or a high-k dielectric material.

In the separation structure 441, a central axis between both side surfaces of the lower separation pattern 415 might not be aligned in the vertical direction Z with a central axis between both side surfaces of the upper separation pattern 438.

Central axes of the lower separation patterns (115 in FIGS. 2B, 6A, and 8B, 115f in FIG. 6B, 115g in FIG. 7, 215 in FIG. 9B, 215a in FIG. 10A, 215b in FIG. 11A, and 215c in FIG. 11C) described above may be aligned with corresponding central axes of the upper separation patterns (138 in FIGS. 2B, 7, and 8B, 138e in FIG. 6A, 138f in FIG. 6A, 238 in FIG. 9B, 238a in FIG. 10A, 238b in FIG. 11A, and 238c in FIG. 11C) in the vertical direction Z, respectively.

In an example embodiment, similarly to the separation structure 441, central axes of the lower separation patterns (115 in FIGS. 2B, 6A, and 8B, 115f in FIG. 6B, 115g in FIG. 7, 215 in FIG. 9B, 215a in FIG. 10A, 215b in FIG. 11A, and 215c in FIG. 11C) described above might not be aligned with central axes of the upper separation patterns (138 in FIGS. 2B, 7, and 8B, 138e in FIG. 6A, 138f in FIG. 6A, 238 in FIG. 9B, 238a in FIG. 10A, 238b in FIG. 11A, and 238c in FIG. 11C) in the vertical direction Z.

In the description below, an example of a method of manufacturing an image sensor in an example embodiment will be described. FIGS. 14, 15, and 16A and 16B are cross-sectional diagrams illustrating a region taken along line I-I' in FIG. 1, illustrating a method of manufacturing the image sensor in an example embodiment.

Figure 14:
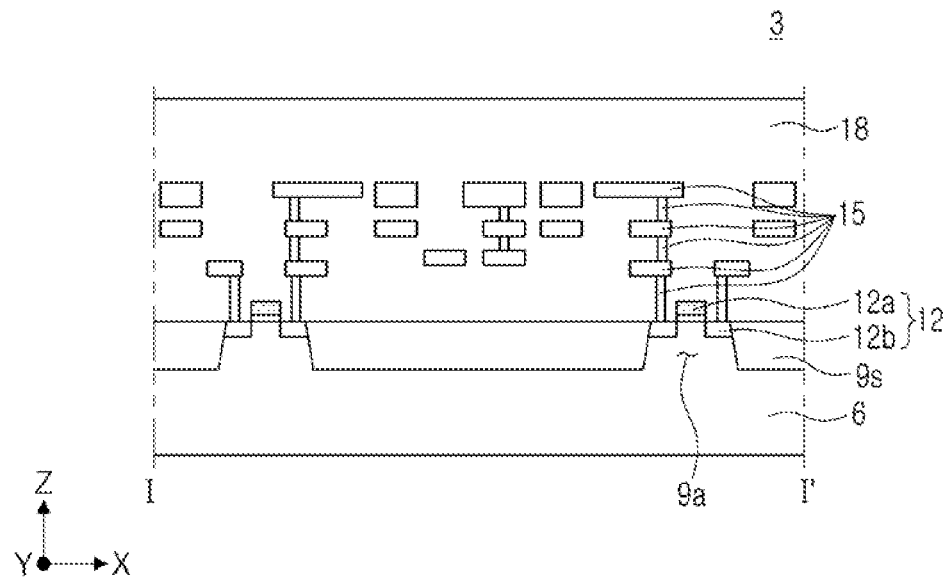
FIGS. 14, 15, 16A, and 16B are cross-sectional diagrams illustrating a method of manufacturing an image sensor according to an example embodiment of the present disclosure.

Referring to FIG. 14, a first chip structure 3 may be formed. The forming the first chip structure 3 may include preparing a first substrate 6, forming an isolation layer 9s defining an active region 9a on the first substrate 6, forming a first circuit device 12 on the first substrate 6, and forming a first interconnection structure 15 electrically connected to the first circuit device 12 on the first substrate 6, and a first insulating layer 18 covering the first circuit device 12 and the first interconnection structure 15.

Figure 15:
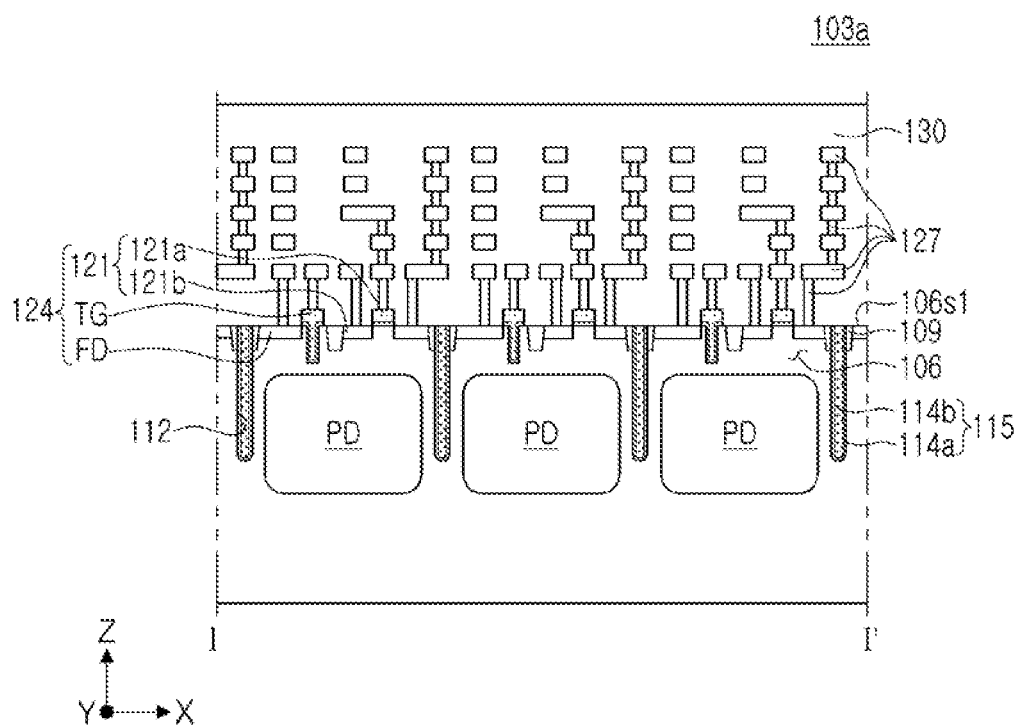

Referring to FIG. 15, a second chip 103a may be formed. The forming the second chip 103a may include preparing a second substrate 106 having a first surface 106s1 and a second surface 106s2 opposing each other, forming a lower separation pattern 115 and photoelectric conversion device regions PD in the second substrate 106, forming an isolation layer 109 defining an active region on the first surface 106s1 of the second substrate 106, and forming a second interconnection structure 127 on the first surface 106s1 of the second substrate 106, and a second insulating layer 130 covering the second circuit device 124 and the second interconnection structure 127. The order of forming the lower separation pattern 115, the photoelectric conversion device regions PD, and the isolation layer 109 may be varied from what is described herein without departing from the spirit and scope of the present disclosure.

In an example, the forming the lower separation pattern 115 may include forming a lower separation trench 112 penetrating the isolation layer 109 and extending into the second substrate 106, forming a lower material layer 114a covering an internal wall of the lower separation trench 112, and forming a lower material pattern 114b filling the lower separation trench 112 on the lower material layer 114a.

Figure 16A:
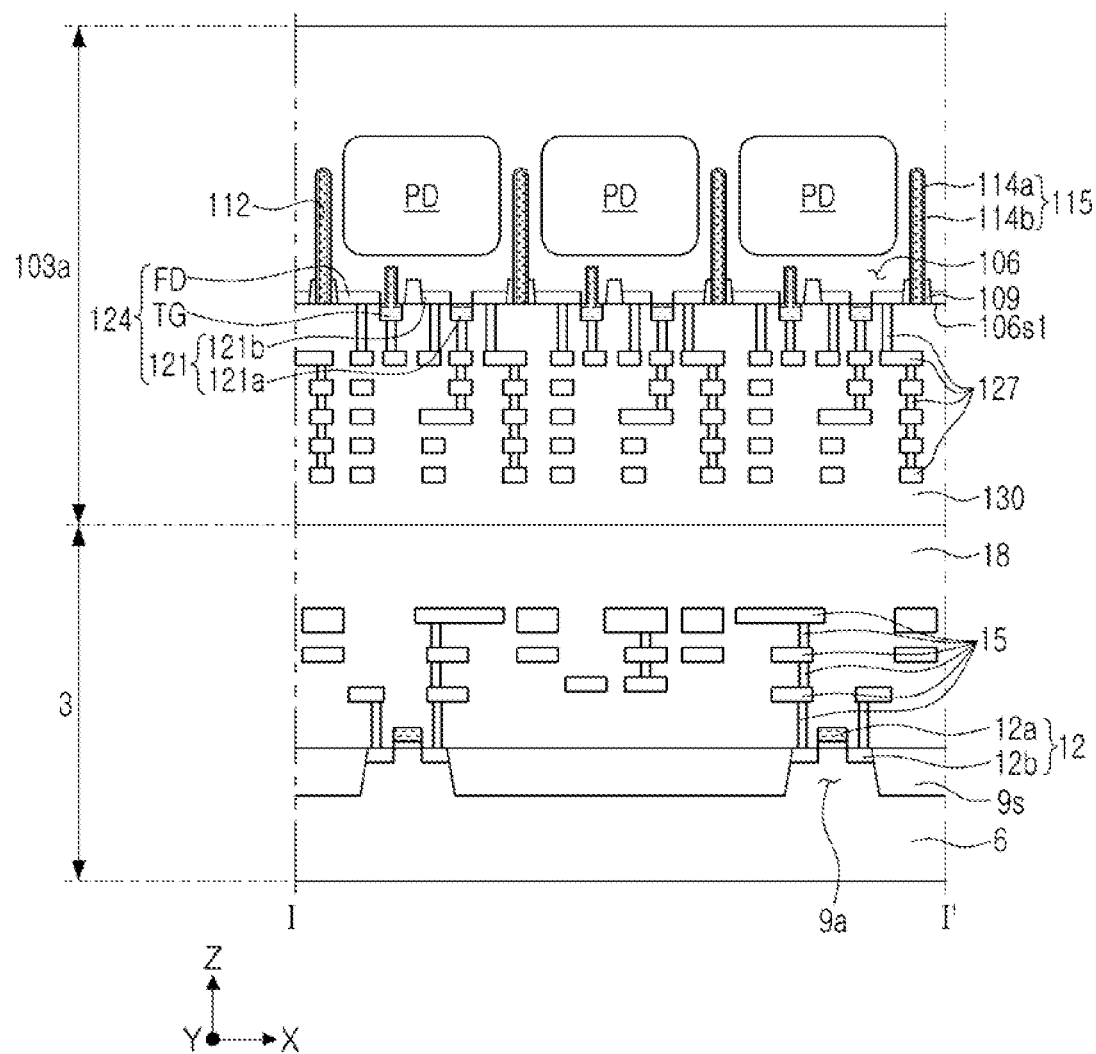

Referring to FIG. 16A, a wafer bonding process of bonding two wafers may be performed to bond the first chip structure 3 with the second chip 103a (in FIG. 15). The first insulating layer 18 of the first chip structure 3 may be bonded to the second insulating layer 130 of the second chip 103a.

Figure 16B:
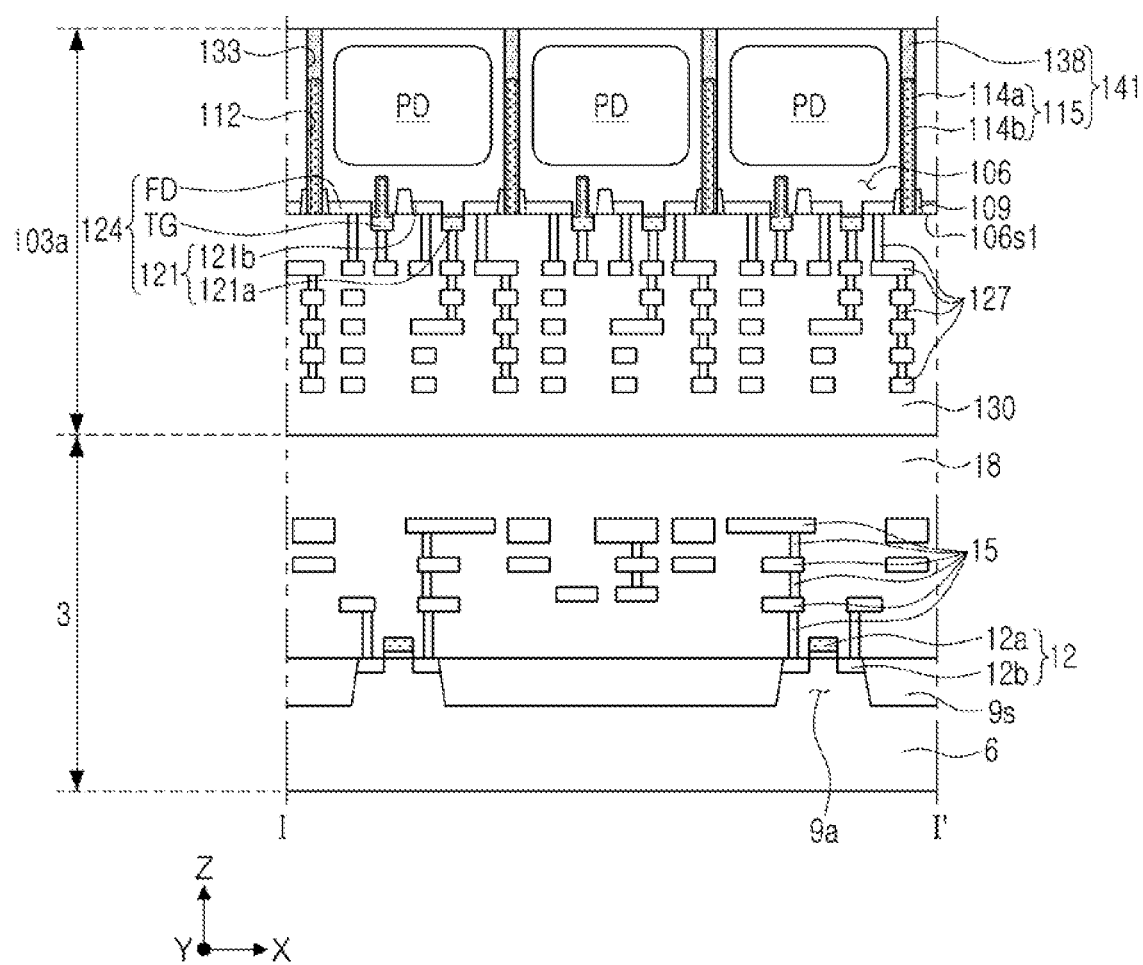

Referring to FIG. 16B, in an example, a grinding process for reducing a thickness of the second substrate 106 of the second chip 103a may be performed. An upper separation pattern 138 may be formed in the second substrate 106 having a reduced thickness. The upper separation pattern 138 and the lower separation pattern 115 may form the separation structure 141.

In an example, the forming the upper separation pattern 138 may include forming an upper separation trench 133 exposing at least a portion of the lower separation pattern 115 by etching the second substrate 106, and filling a material for forming the upper separation pattern 138 in the upper separation trench 133. Accordingly, the upper separation pattern 138 may be formed in the upper separation trench 133.

Referring back to FIG. 2A, an insulating structure 145 may be formed on the second surface 106s2 of the second substrate 106. A grid pattern structure 150 may be formed on the insulating structure 145. Color filters 160 covering the grid pattern structure 150 may be formed on the insulating structure 145, and microlenses 170 may be formed on the color filters 160.

According to the aforementioned example embodiments, an image sensor including the separation structure including a lower separation pattern and an upper separation pattern on the lower separation pattern may be provided. A vertical length of one of the lower separation pattern and the upper separation pattern may be greater than a vertical length of the other, and the upper surface of the lower separation pattern and/or the lower surface of the upper separation pattern may have a wavy or sawtooth shape in which concave portions and convex portions may be alternately arranged in one horizontal direction. The separation structure may reduce dark current and may prevent cross talk, such that signal noise of the image sensor may be addressed, and resolution of the image sensor may be increased.

While the example embodiments have been illustrated and described above, it will be apparent to those skilled in the art that modifications and variations could be made without departing from the scope of the present disclosure.

What is claimed is:

1. An image sensor, comprising:
a substrate having a first surface and a second surface opposite to the first surface;
a separation structure penetrating the substrate;
photoelectric conversion device regions spaced apart from each other by the separation structure;
color filters disposed on the second surface of the substrate; and
microlenses disposed on the color filters,
wherein the separation structure includes a lower separation pattern and an upper separation pattern disposed on the lower separation pattern,
wherein the separation structure includes first line portions that are parallel to each other and extend in a horizontal direction, and second line portions perpendicularly intersecting the first line portions, the second line portions being parallel to each other,
wherein in one of the first line portions of the separation structure, an upper surface of the lower separation pattern and/or a lower surface of the upper separation pattern has a wavy or sawtooth shape, and
wherein, in intersecting regions in which the first line portions and the second line portions intersect each other, a vertical length of one of the lower separation pattern and the upper separation pattern is about 2 to about 10 times greater than a vertical length of the other.

2. The image sensor of claim 1, wherein, in the intersecting regions, a difference between a level of the upper surface of the lower separation pattern and a level of the first surface of the substrate is about 3 to about 9 times greater than a second difference between the level of the upper surface of the lower separation pattern and a level of the second surface of the substrate.

3. The image sensor of claim 1,
wherein, in the intersecting regions, a vertical length of the lower separation pattern is greater than a vertical length of the upper separation pattern, and
wherein, in the intersecting regions, a first difference between a level of the upper surface of the lower separation pattern and a level of the first surface of the substrate is about 1.5 μm to about 10 μm.

4. The image sensor of claim 1, wherein the lower separation pattern includes a lower material pattern and a lower material layer covering at least a side surface of the lower material pattern.

5. The image sensor of claim 4,
wherein the lower material pattern includes polysilicon, and
wherein the lower material layer includes silicon oxide.

6. The image sensor of claim 4, wherein the upper separation pattern includes an insulating material.

7. The image sensor of claim 1, further comprising:
an insulating structure disposed between the second surface of the substrate and the color filters,
wherein the insulating structure includes a plurality of stacked layers, and
wherein the plurality of layers include a silicon oxide layer and a high-k dielectric layer.

8. The image sensor of claim 7, wherein at least a portion of the plurality of layers of the insulating structure and the upper separation pattern form a unified structure.

9. The image sensor of claim 1, further comprising:
a semiconductor region disposed between the lower separation pattern and the upper separation pattern,
wherein the upper surface of the lower separation pattern has a first upper surface in contact with the upper separation pattern and a second upper surface spaced apart from the upper separation pattern, and
wherein the semiconductor region is disposed between the second upper surface of the lower separation pattern and the upper separation pattern.

10. The image sensor of claim 9,
wherein the semiconductor region has an upper surface that is in contact with the upper separation pattern and a lower surface that is in contact with the lower separation pattern, and
wherein the upper surface of the semiconductor region is convex.

11. The image sensor of claim 9,
wherein the semiconductor region has an upper surface that is in contact with the upper separation pattern and a lower surface that is in contact with the lower separation pattern, and
wherein the upper surface of the semiconductor region is concave.

12. The image sensor of claim 1, further comprising:
an isolation layer extending from the first surface of the substrate into the substrate and having an upper surface disposed in the substrate,
wherein the upper surface of the lower separation pattern is disposed on a level higher than a level of the upper surface of the isolation layer with reference to the first surface of the substrate.

13. The image sensor of claim 1, wherein in one of the first line portions of the separation structure, an upper surface of the lower separation pattern is convex.

14. An image sensor, comprising:
a first chip structure including a first substrate, a first circuit device and a first interconnection structure disposed on the first substrate, and a first insulating layer covering the first circuit device and the first interconnection structure disposed on the first substrate; and
a second chip structure disposed on the first chip structure,
wherein the second chip structure includes:
a second substrate having a first surface opposing the first chip structure and a second surface opposing the first surface;
a second circuit device and a second interconnection structure disposed between the first surface of the second substrate and the first chip structure;
a second insulating layer covering the second circuit device and the second interconnection structure disposed between the first surface of the second substrate and the first chip structure;
a separation structure disposed in the second substrate;
photoelectric conversion device regions spaced apart from each other by the separation structure;
an insulating structure disposed on the second surface of the second substrate;
color filters disposed on the insulating structure; and
microlenses disposed on the color filters,
wherein the separation structure includes a lower separation pattern having an upper surface disposed in the second substrate and an upper separation pattern having a lower surface disposed in the second substrate,
wherein at least a portion of the upper surface of the lower separation pattern is in contact with at least a portion of the lower surface of the upper separation pattern,
wherein the separation structure includes first line portions that are parallel to each other and extend in a first horizontal direction, and second line portions perpendicularly intersecting the first line portions and extending parallel to each other,
wherein each of the first line portions includes line regions and intersecting regions alternately arranged in the first horizontal direction,
wherein the intersecting regions of the first line portions are regions of the first line portions intersecting the second line portions,
wherein, the upper surface of the lower separation pattern has a wavy or sawtooth shape,
wherein, in the intersecting regions, a vertical length of the lower separation pattern is greater than a vertical length of the upper separation pattern, and
wherein, in the intersecting regions, a first difference between a level of the upper surface of the lower separation pattern and a level of the first surface of the second substrate is about 1.5 µm to about 10 µm.

15. The image sensor of claim 14,
wherein the wavy shape of the upper surface of the lower separation pattern includes concave portions and convex portions alternately arranged,
wherein upper ends of the convex portions of the upper surface of the lower separation pattern are disposed in the intersecting regions,
wherein lower ends of the concave portions of the upper surface of the lower separation pattern are disposed in the line regions,
wherein, the upper surface of the lower separation pattern is convex,
wherein the lower separation pattern includes a lower material pattern and a lower material layer covering a side surface and an upper surface of the lower material pattern,
wherein the lower material pattern includes polysilicon,
wherein the lower material layer includes silicon oxide, and
wherein the upper separation pattern includes insulating material.

16. The image sensor of claim 14, wherein, in the intersecting regions, the first difference between the level of the upper surface of the lower separation pattern and the level of the first surface of the second substrate is about 2 to about 10 times greater than a second difference between the level of the upper surface of the lower separation pattern and a level of the second surface of the second substrate.

17. The image sensor of claim 14, further comprising:
a semiconductor region disposed between the lower separation pattern and the upper separation pattern,
wherein the upper surface of the lower separation pattern has a first upper surface that is in contact with the upper separation pattern and a second upper surface that is spaced apart from the upper separation pattern,
wherein the lower surface of the upper separation pattern has a first lower surface that is in contact with the first upper surface of the lower separation pattern and a second lower surface that is spaced apart from the lower separation pattern, and
wherein the semiconductor region is disposed between the second upper surface of the lower separation pattern and the second lower surface of the upper separation pattern.

18. An image sensor, comprising:
a first chip structure including a first substrate, a first circuit device and a first interconnection structure disposed on the first substrate, and a first insulating layer covering the first circuit device and the first interconnection structure; and a second chip structure disposed on the first chip structure, wherein the second chip structure includes:
- a second substrate having a first surface opposing the first chip structure and a second surface opposing the first surface;
- a separation structure disposed in the second substrate;
- a second circuit device and a second interconnection structure disposed between the first surface of the second substrate and the first chip structure;
- a second insulating layer covering the second circuit device and the second interconnection structure between the first surface of the second substrate and the first chip structure;
- photoelectric conversion device regions disposed in the second substrate;
- an insulating structure disposed on the second surface of the second substrate;
- color filters disposed on the insulating structure; and
- microlenses disposed on the color filters, wherein the separation structure includes a lower separation pattern and an upper separation pattern disposed on the lower separation pattern, wherein the separation structure includes first line portions that are parallel to each other and extend in a first horizontal direction, and second line portions perpendicularly intersecting the first line portions and extending parallel to each other, wherein each of the first line portions includes line regions and intersecting regions alternately arranged in the first horizontal direction, wherein, in the first line portions, the intersecting regions are regions of the first line portions intersecting the second line portions, wherein an upper surface of the lower separation pattern and/or a lower surface of the upper separation pattern has a wavy or sawtooth shape, and wherein, in the intersecting regions, a vertical length of one of the lower separation pattern and the upper separation pattern is about 2 to about 10 times greater than a vertical length of the other.

19. The image sensor of claim 18, wherein one of the lower separation pattern and the upper separation pattern includes a polysilicon pattern and an insulating layer covering a side surface of the polysilicon pattern.

20. The image sensor of claim 18,
wherein, in the intersecting regions, a vertical length of the lower separation pattern is greater than a vertical length of the upper separation pattern, and
wherein the vertical length of the lower separation pattern is about 1.5 μm to about 10 μm.

* * * * *